United States Patent
Ho et al.

(10) Patent No.: US 10,056,299 B2
(45) Date of Patent: Aug. 21, 2018

(54) METAL GATE STRUCTURE AND MANUFACTURING METHOD THEREOF

(71) Applicant: TAIWAN SEMICONDUCTOR MANUFACTURING COMPANY LTD., Hsinchu OT (TW)

(72) Inventors: Wei-Shuo Ho, New Taipei (TW); Tsung-Yu Chiang, New Taipei (TW); Kuang-Hsin Chen, Jung-Li (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/358,061

(22) Filed: Nov. 21, 2016

(65) Prior Publication Data

US 2017/0125301 A1    May 4, 2017

Related U.S. Application Data

(62) Division of application No. 14/464,197, filed on Aug. 20, 2014, now Pat. No. 9,614,088.

(51) Int. Cl.
*H01L 21/8234* (2006.01)
*H01L 29/78* (2006.01)
(Continued)

(52) U.S. Cl.
CPC .. *H01L 21/823431* (2013.01); *H01L 21/0214* (2013.01); *H01L 21/02164* (2013.01);
(Continued)

(58) Field of Classification Search
CPC ........... H01L 21/0214; H01L 21/02164; H01L 21/283; H01L 21/30604; H01L 21/31144;
(Continued)

(56) References Cited

U.S. PATENT DOCUMENTS 6,660,462 B1   12/2003   Fukuda
6,867,080 B1   3/2005    Paton et al.
(Continued)

FOREIGN PATENT DOCUMENTS

CN   1607669 A    4/2005
CN   102315213 A  1/2012

OTHER PUBLICATIONS

Office Action and search report from Chinese patent office, dated Sep. 28, 2017, which cites U.S. Pat. No. 6660462, U.S. Pat. No. 6867080, and CN1607669, for corresponding China application 201410800258.

(Continued)

*Primary Examiner* — Bac Au
(74) *Attorney, Agent, or Firm* — WPAT, P.C., Intellectual Property Attorneys; Anthony King

(57) ABSTRACT

A method of manufacturing a semiconductor structure includes receiving a substrate; patterning a first active region, a second active region and an isolation between the first active region and the second active region over the substrate; disposing an inter-level dielectric (ILD) over the substrate; forming a first gate extended over the first active region, the isolation and the second active region; and forming a second gate over the first active region and the second active region, wherein the second gate includes a first section disposed over the first active region and a second section disposed over the second active region, a portion of the ILD is disposed between the first section and the second section.

18 Claims, 28 Drawing Sheets

(51) Int. Cl.
| | |
|---|---|
| *H01L 21/02* | (2006.01) |
| *H01L 21/283* | (2006.01) |
| *H01L 21/306* | (2006.01) |
| *H01L 21/311* | (2006.01) |
| *H01L 21/324* | (2006.01) |
| *H01L 21/768* | (2006.01) |
| *H01L 27/02* | (2006.01) |
| *H01L 27/088* | (2006.01) |
| *H01L 29/06* | (2006.01) |
| *H01L 29/51* | (2006.01) |
| *H01L 29/66* | (2006.01) |
| *H01L 29/49* | (2006.01) |

(52) U.S. Cl.
CPC ...... *H01L 21/283* (2013.01); *H01L 21/30604* (2013.01); *H01L 21/31144* (2013.01); *H01L 21/324* (2013.01); *H01L 21/76804* (2013.01); *H01L 21/823456* (2013.01); *H01L 21/823481* (2013.01); *H01L 27/0207* (2013.01); *H01L 27/0886* (2013.01); *H01L 29/0649* (2013.01); *H01L 29/4916* (2013.01); *H01L 29/518* (2013.01); *H01L 29/6681* (2013.01); *H01L 29/7851* (2013.01)

(58) Field of Classification Search
CPC ............. H01L 21/324; H01L 21/76804; H01L 21/823431; H01L 21/823456; H01L 21/823481; H01L 27/0207; H01L 27/0886; H01L 29/0649; H01L 29/4916; H01L 29/518; H01L 29/6681; H01L 29/7851
See application file for complete search history.

(56) References Cited

U.S. PATENT DOCUMENTS

| | | | |
|---|---|---|---|
| 7,288,810 B2 | 10/2007 | Yang | |
| 7,667,271 B2 | 2/2010 | Yu et al. | |
| 7,910,453 B2 | 3/2011 | Xu et al. | |
| 8,183,644 B1 * | 5/2012 | Chuang | H01L 21/823871 257/369 |
| 8,354,726 B2 * | 1/2013 | Tsutsui | H01L 21/823412 257/369 |
| 8,377,779 B1 | 2/2013 | Wang | |
| 8,399,931 B2 | 3/2013 | Liaw et al. | |
| 8,652,894 B2 | 2/2014 | Lin et al. | |
| 8,669,596 B2 * | 3/2014 | Tamaru | H01L 21/823456 257/206 |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,231,106 B2 * | 1/2016 | Tseng | H01L 29/66795 |
| 9,401,415 B2 * | 7/2016 | Chang | H01L 29/66795 |
| 2009/0108358 A1 * | 4/2009 | Lee | H01L 29/66621 257/368 |
| 2013/0187237 A1 * | 7/2013 | Yu | H01L 21/823807 257/369 |
| 2013/0200395 A1 | 8/2013 | Liaw et al. | |
| 2013/0256764 A1 * | 10/2013 | Liaw | H01L 29/66795 257/288 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0236123 A1 * | 8/2015 | Chang | H01L 29/7848 257/347 |
| 2015/0311342 A1 * | 10/2015 | Lin | H01L 29/7848 257/190 |

OTHER PUBLICATIONS

U.S. Pat. No. 7288810 corresponds to CN1607669.
Office Action and search report from Chinese patent office dated Jun. 6, 2018 for corresponding China application 201410800258.X.
US20130200395 corresponds to CN102315213A.

* cited by examiner

METAL GATE STRUCTURE AND MANUFACTURING METHOD THEREOF

PRIORITY CLAIM AND CROSS-REFERENCE

This application claims the benefit of U.S. non-provisional application Ser. No. 14/464,197 filed on Aug. 20, 2014, entitled "Metal Gate Structure And Manufacturing Method Thereof", the disclosure of which is hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Polysilicon is used as a gate electrode in a semiconductor device such as metal oxide semiconductor (MOS). However, with a trend toward scaling down the size of the semiconductor device, the polysilicon gate has low performance such as reduction of gate capacitance and driving force of the semiconductor device. In some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

There are many challenges on fabrication of the MG electrode in decreased feature size of the semiconductor device. Thus, there is a continuous need to enhance a metal gate structure, simplifying a manufacturing method of the metal gate on a substrate and improving a performance of the semiconductor device including the MG electrode.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1A:
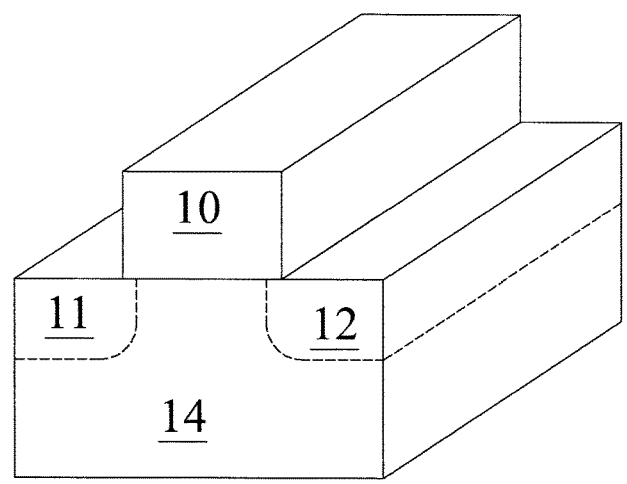
FIG. 1A is a right side perspective view of a transistor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
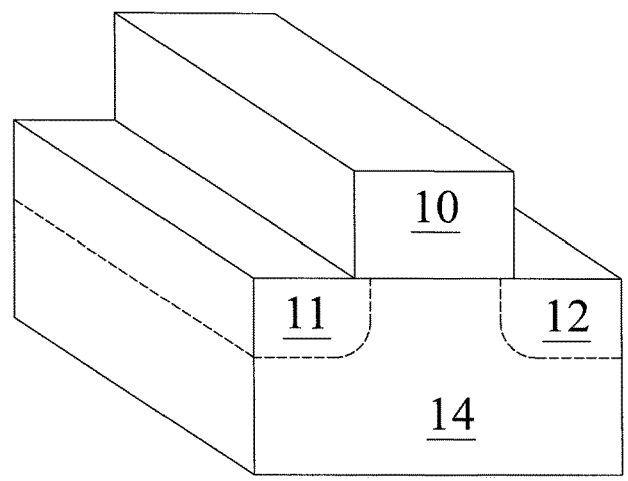
FIG. 1B is a left side perspective view of a transistor in accordance with some embodiments of the present disclosure.
Figure 1C:
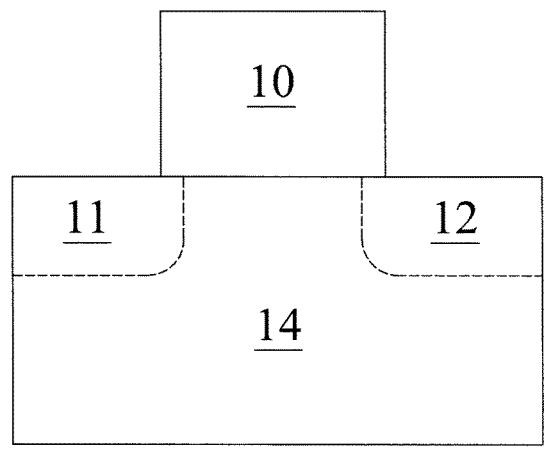
FIG. 1C is a front cross sectional view of a transistor in accordance with some embodiments of the present disclosure.

A semiconductor device includes a transistor. FIGS. 1A and 1B show right side and left side perspective views of an embodiment of a transistor respectively. FIG. 1C is a front view of the transistor of FIGS. 1A and 1B. The transistor includes a substrate 14 and a metal gate 10 disposed over a surface of the substrate 14. The metal gate 10 is fabricated between an active region including doped regions (11, 12), which can be either source or a drain.

Figure 2A:
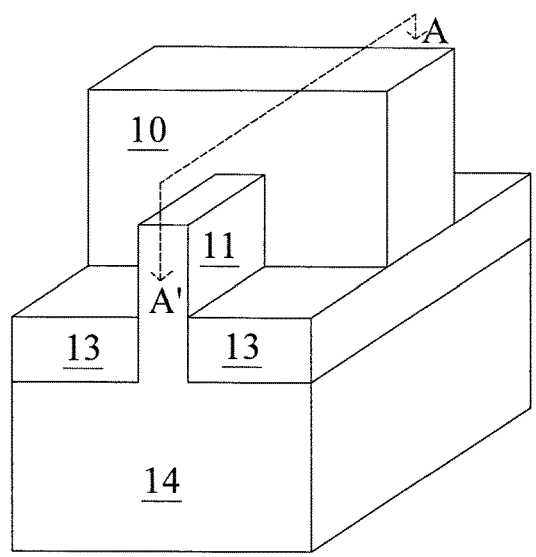
FIG. 2A is a front perspective view of a FinFET in accordance with some embodiments of the present disclosure.
Figure 2B:
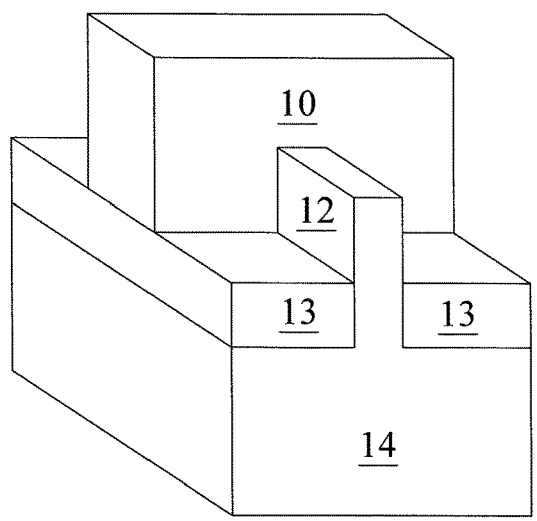
FIG. 2B is a rear perspective view of a FinFET in accordance with some embodiments of the present disclosure.
Figure 2C:
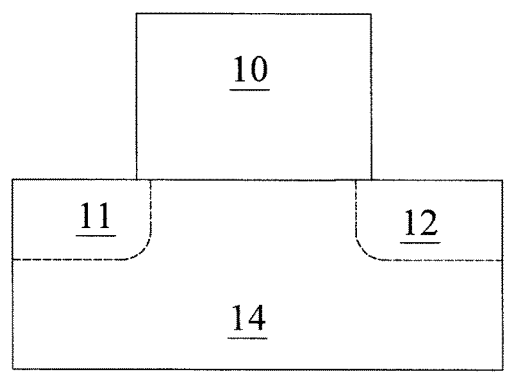
FIG. 2C is a cross sectional view of a FinFET of FIG. 2A along AA' in accordance with some embodiments of the present disclosure.

In another semiconductor device, a transistor is configured with several fins as a FinFET (Fin Field-Effect Transistor). FIGS. 2A and 2B show front and rear views of an embodiment of a FinFET. FIG. 2C is a cross sectional view of the FinFET of FIG. 2A along AN. The FinFET includes a substrate 14, a dielectric layer 13 and a metal gate 10. The substrate 14 includes doped regions (11, 12), which can be either a source or a drain, extending upright respectively in fin configuration and are partially surrounded by the dielectric layer 13.

The metal gate is formed by depositing a metal film within an opening of an interlayer dielectric (ILD) disposed over the substrate. However, as a dimension of the metal gate is in a high aspect ratio, the opening is very small. The ratio of a width to a height of the metal gate is generally greater than 10. Due to the high aspect ratio, a formation of the metal gate is an issue. Such a small opening of the ILD may not be deposited with the metal film sufficiently and fully. An insufficient metal film deposition would induce an incorrect work function and affect a threshold voltage of the metal gate.

In the present disclosure, a semiconductor structure with a structural improvement on a metal gate is disclosed. The semiconductor structure includes a substrate and an inter interlayer dielectric (ILD) over the substrate. The ILD includes a recessed portion, and a polysilicon is disposed within the recessed portion. The polysilicon is then removed, and the recessed portion is deposited with a metal film. Upon removal of the polysilicon, an opening of the recessed portion is increased due to an internal tensile stress developed within the ILD. The internal stress would shrink the ILD and therefore the opening of the recessed portion would be enlarged. The enlarged opening of the ILD would facilitate the metal film deposition and the formation of the metal gate, ultimately a performance of the semiconductor structure is improved.

Figure 3:
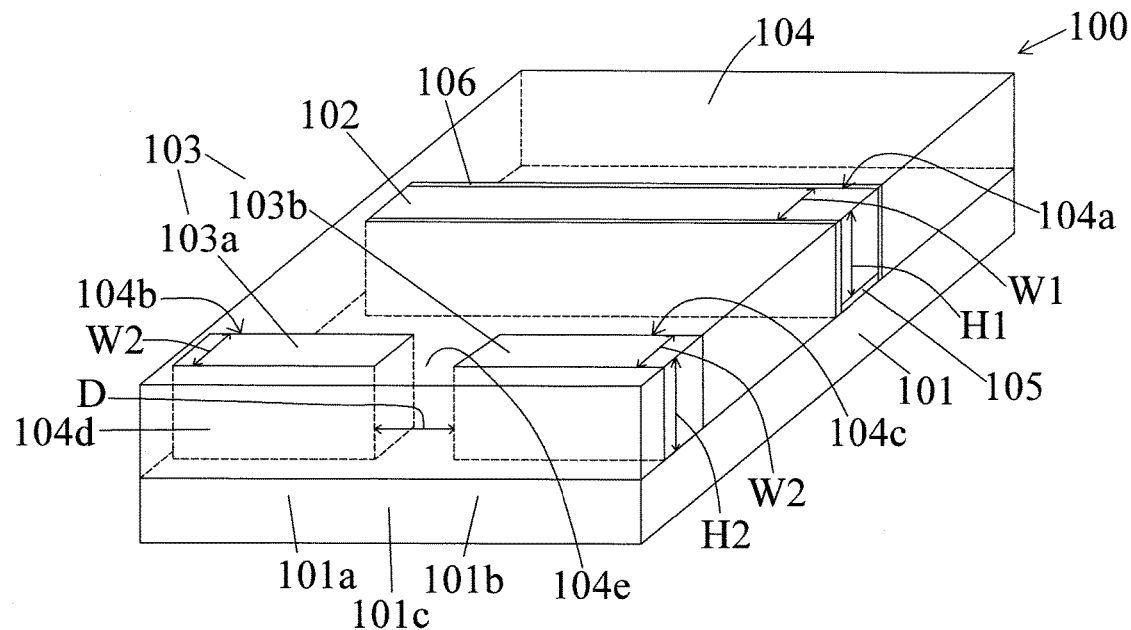
FIG. 3 is a schematic view of a semiconductor structure in accordance with some embodiments of the present disclosure.
Figure 4:
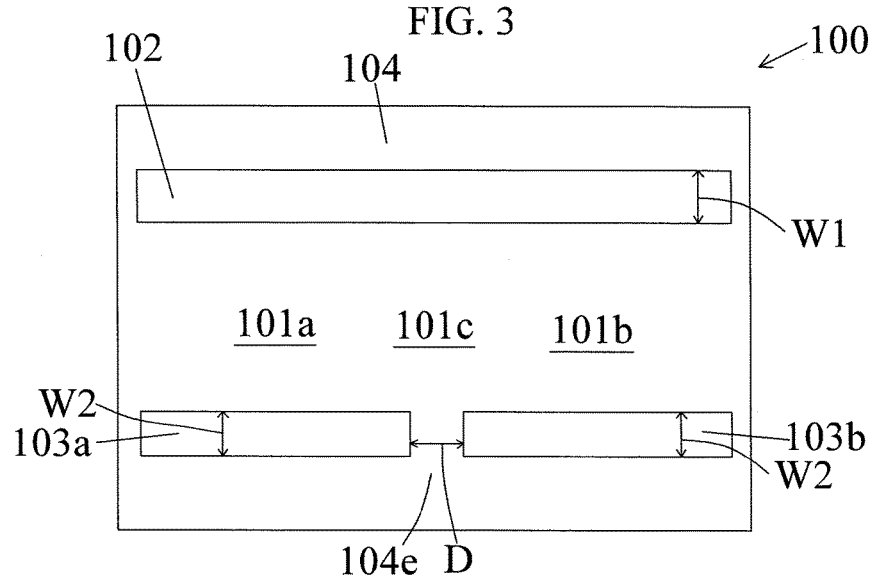
FIG. 4 is a top view of a semiconductor structure of FIG. 3 in accordance with some embodiments of the present disclosure.

FIG. 3 and FIG. 4 respectively are a semiconductor structure 100 in accordance with various embodiments of the present disclosure. FIG. 3 is a perspective view of the semiconductor structure 100, and FIG. 4 is a top plan view of the semiconductor structure 100. In some embodiments, the semiconductor structure 100 includes a substrate 101, several gates and an interlayer dielectric (ILD) 104. In some embodiments, the substrate 101 includes germanium, silicon germanium, gallium arsenic or other suitable semiconductor materials. In some embodiments, the substrate 101 is a semiconductor on insulator such as silicon on insulator (SOI). In some embodiments, the substrate 101 is a compound semiconductor substrate in a multilayer silicon structure.

In some embodiments, the substrate 101 includes a first active region 101a, a second active region 101b and an isolation 101c disposed between the first active region 101a and the second active region 101b. In some embodiments, the first active region 101a and the second active region 101b respectively include a transistor. In some embodiments, the first active region 101a is doped with P-type dopants such as boron or N-type dopants such as phosphorus or arsenic. Similarly, the second active region 101b is doped with the P-type or N-type dopants.

The isolation 101c is interposed between the first active region 101.a and the second active region 101b to electrically isolate them from each other. In some embodiments, the isolation 101c includes materials such as silicon oxide, silicon nitride, silicon oxynitride, fluoride-doped silicate glass (FSG), a low-k dielectric material and/or combinations thereof. In some embodiments, the isolation 101c is a shallow trench isolation (STI).

There are several gates (102, 103) disposed over the substrate 101. In some embodiments, the gates (102, 103) are surrounded by the ILD 104. In some embodiments, the ILD 104 includes silicon oxide, silicon dioxide, silicon oxynitride, silicon oxynitride doped with hydrogen or silicon oxide doped with carbon. In some embodiments, the ILD 104 includes a high density plasma (HDP) dielectric material (e.g., HDP oxide) and/or a high aspect ratio process (HARP) dielectric material (e.g., HARP oxide). It is understood that the ILD 101 may include one or more dielectric materials and/or one or more dielectric layers.

In some embodiments, the ILD 104 includes several recesses (104a, 104b, 104c), and the gates (102, 103) are disposed within the recesses (104a, 104b, 104c) correspondingly. In some embodiments, each recess (104a, 104b, 104c) has a sidewall 104d substantially orthogonal to the substrate 101.

Each of the recesses (104a, 104b, 104c) has a width (W1, W2) and a height (H1, H2). In some embodiments, the recesses (104a, 104h, 104c) have a consistent width (W1, W2), for example the width W1 is substantially equal to the width W2. In some embodiments, the recesses (104a, 104b, 104c) have a consistent height (H1, H2), for example the height H1 is substantially equal to the height H2. An aspect ratio of each recess (104a, 104b, 104c) is high. In some embodiments, the aspect ratio of each recess (104a, 104b, 104c) is substantially greater than about 10. In some embodiments, a ratio of the width W1 to the height H1 or the width W2 to the height H2 is substantially greater than 1:10.

In some embodiments, the gates include a first gate 102 and a second gate 103. In some embodiments, the first gate 102 and the second gate 103 respectively includes a polysilicon or a gate fill metal. In some embodiments, an oxide layer 105 is disposed at a bottom of the first gate 102 and is contacted with the substrate 101. In some embodiments, a spacer 106 is disposed along the sidewall 104d of the recess (104a, 104b, 104c) or a sidewall of the first gate 102.

In some embodiments, the first gate 102 is extended over the first active region 101a, the isolation 101c and the second active region 101b, and the second gate 103 is disposed over the first active region 101a and the second active region 101b. In some embodiments, the first gate 102 has a width W1 and a height H1, while the second gate 103 has a width W2 and a height H2. An aspect ratio of the first gate 102 or the second gate 103 is high. In some embodiments, the aspect ratio of the first gate 102 or the second gate 103 is substantially greater than about 10. In some embodiments, a ratio of the width W1 to the height H1 or the width W2 to the height H2 is substantially greater than 1:10.

In some embodiments, the second gate 103 is configured not to conduct current flow. In some embodiments, the first gate 102 is a control gate, while the second gate 103 is a dummy gate. The second gate 103 is divided into two sections (103a, 103b). In some embodiments, the second gate 103 includes a first section 103a and a second section 103b. In some embodiments, the first section 103a is disposed over the first active region 101a, and the second section 103h is disposed over the second active region 101b.

The first section 103a is distanced from the second section 103b. In some embodiments, a portion 104e of the ILD 104 is disposed between the first section 103a and the second section 103b. The portion 104e of the ILD 104 separates the first section 103a from the second section 103b. In some embodiments, the portion 104e of the ILD 104 is disposed over the isolation 101c. Referring to FIG. 4, the first section 103a and the second section 103b are separated from each other in a distance D.

Figure 5:
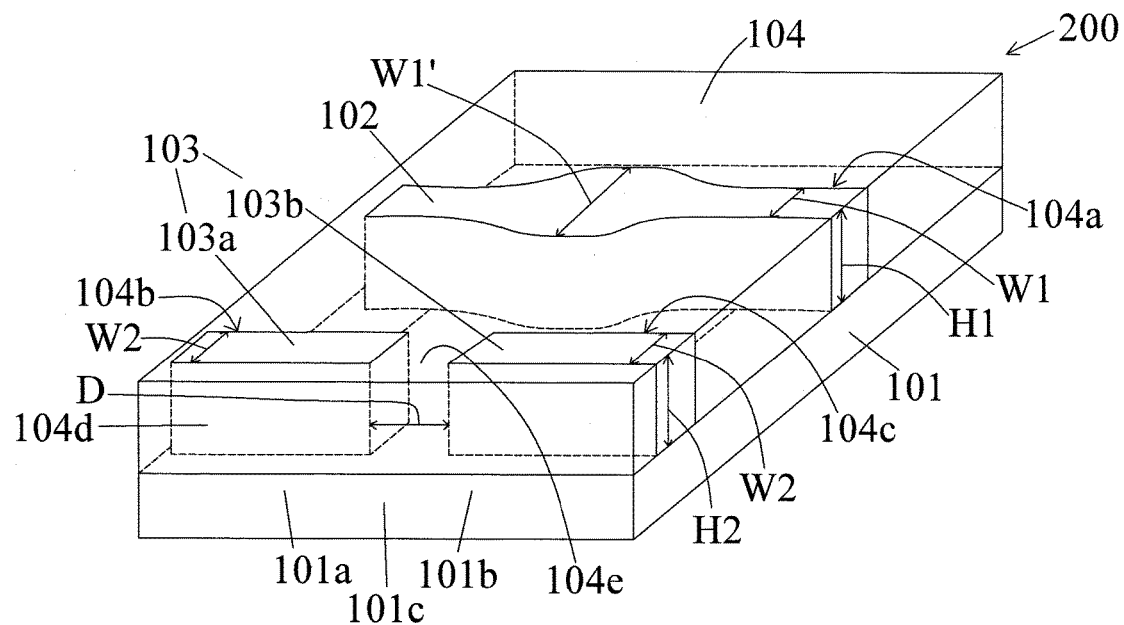
FIG. 5 is a schematic view of a semiconductor structure in accordance with some embodiments of the present disclosure.
Figure 6:
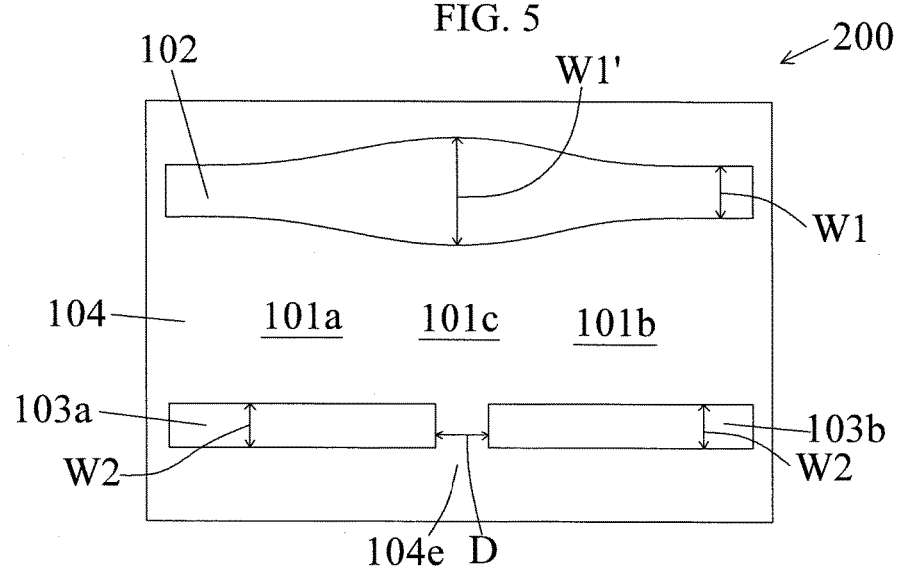
FIG. 6 is a top view of a semiconductor structure of FIG. 5 in accordance with some embodiments of the present disclosure.

FIG. 5 and FIG. 6 respectively are a semiconductor structure 200 in accordance with various embodiments of the present disclosure. FIG. 5 is a perspective view of the semiconductor structure 200, and FIG. 6 is a top plan view of the semiconductor structure 200. The semiconductor structure 200 has similar configuration as the semiconductor structure 100 of FIG. 3 and FIG. 4.

In some embodiments, the recess 104a of the ILD 104 is extended in an inconsistent width. In some embodiments, a portion of the recess 104a disposed opposite to the portion 104e of the ILD 104 has a width W1', and the width W1' is substantially greater than the width W1 or the width W2 of the recess 104b or the recess 104c. In some embodiments, the recess 104a disposed over the isolation 101c has the width W1'.

In some embodiments, the first gate 102 is elongated over the substrate 101 in an inconsistent width. In some embodiments, a portion of the first gate 102 disposed opposite to the portion 104e of the ILD 104 has the width WP, and the width W1' is substantially greater than the width W1 or the width W2 of the second gate 103. In some embodiments, the first gate 102 disposed over the isolation 101c has the width W1'.

Figure 7:
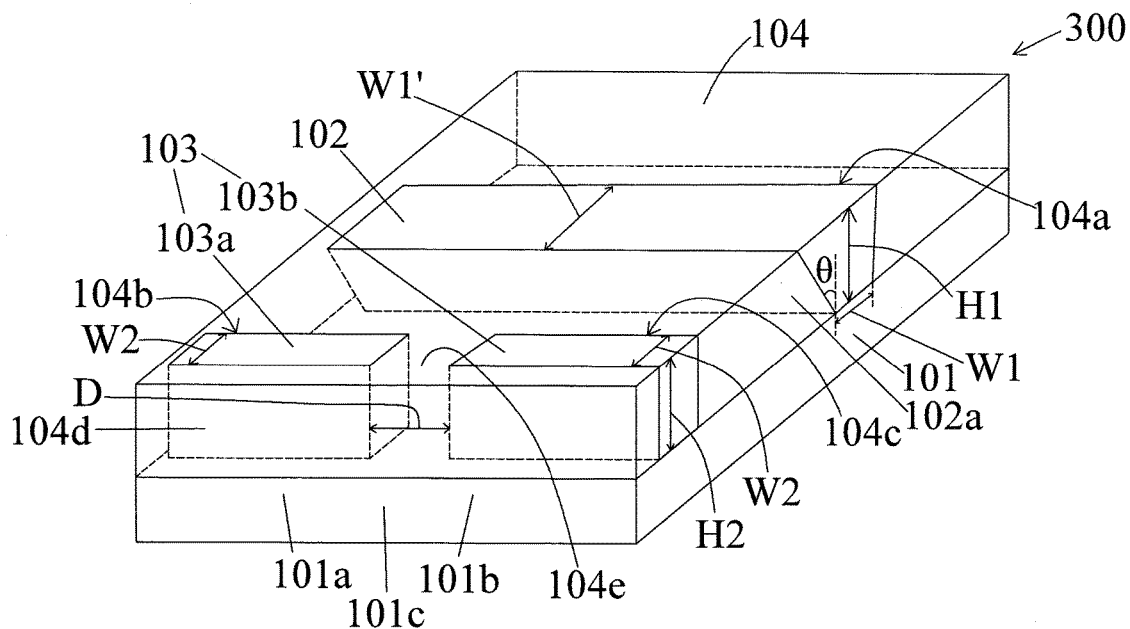
FIG. 7 is a schematic view of a semiconductor structure in accordance with some embodiments of the present disclosure.
Figure 8:
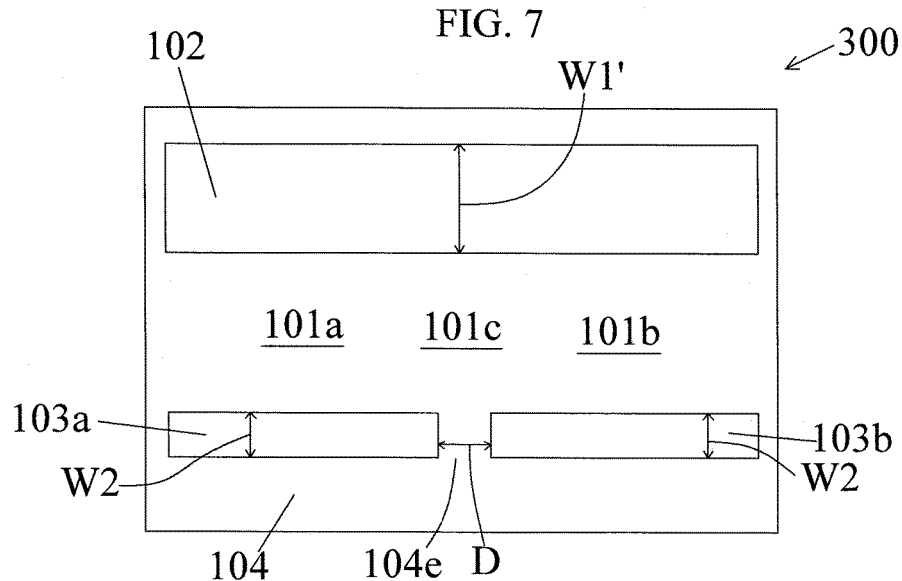
FIG. 8 is a top view of a semiconductor structure of FIG. 5 in accordance with some embodiments of the present disclosure.

FIG. 7 and FIG. 8 respectively are a semiconductor structure 300 in accordance with various embodiments of the present disclosure. FIG. 7 is a perspective view of the semiconductor structure 300, and FIG. 8 is a top plan view of the semiconductor structure 300. The semiconductor structure 300 has similar configuration as the semiconductor structure 100 of FIG. 3 and FIG. 4.

In some embodiments, the recess 104a of the ILD 104 has a larger opening. The recess 104a is in a tapered configuration, that a width W1' of a top part of the recess 104a is greater than a width W1 of a bottom part of the recess 104a. In some embodiments, the width WP of the top part of the recess 104a is greater than a width W2 of the recess 104b.

Similarly, the first gate 102 is in a tapered configuration. A top part of the first gate 102 has the width WP greater than the width W1 of a bottom part of the first gate 102. In some embodiments, the width W1' of the top part of the first gate 102 is greater than the width W2 of the second gate 103.

In some embodiments, a sidewall 102a of the first gate 102 is tilted in an angle θ. The angle θ is defined between the sidewall 102a of the first gate 102 and an axis orthogonal to the substrate 101. In some embodiments, the angle θ is about 1° to about 10°.

Figure 9:
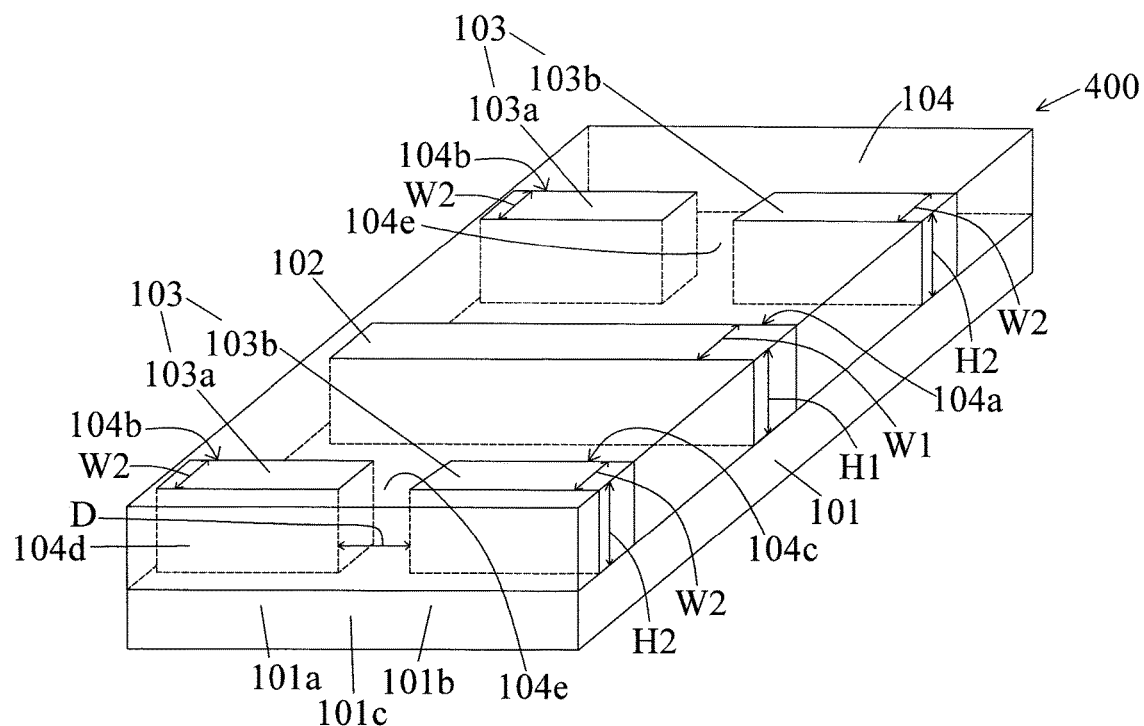
FIG. 9 is a schematic view of a semiconductor structure in accordance with some embodiments of the present disclosure.
Figure 10:
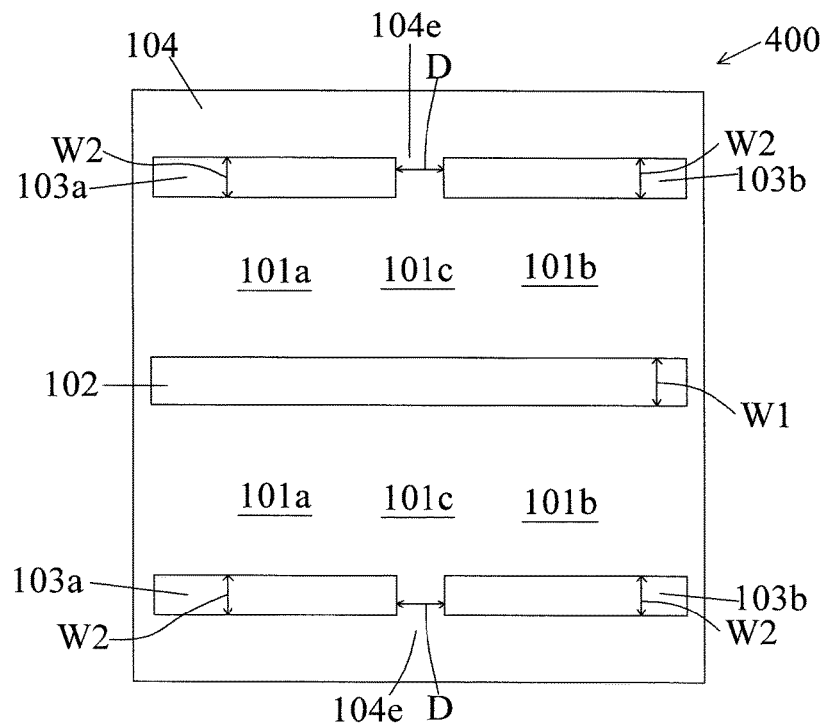
FIG. 10 is a top view of a semiconductor structure of FIG. 9 in accordance with some embodiments of the present disclosure.

FIG. 9 and FIG. 10 respectively are a semiconductor structure 400 in accordance with various embodiments of the present disclosure. FIG. 9 is a perspective view of the semiconductor structure 400, and FIG. 10 is a top plan view of the semiconductor structure 400. The semiconductor structure 400 has similar configuration as the semiconductor structure 100 of FIG. 3 and FIG. 4.

In some embodiments, the semiconductor structure 400 includes one or more second gates 103. As shown in FIG. 9 and FIG. 10, there are two second gates 103 surrounding the first gate 102. The two second gates 103 are interposed by the first gate 102. In some embodiments, two second gates 103 are in same configuration.

Figure 11:
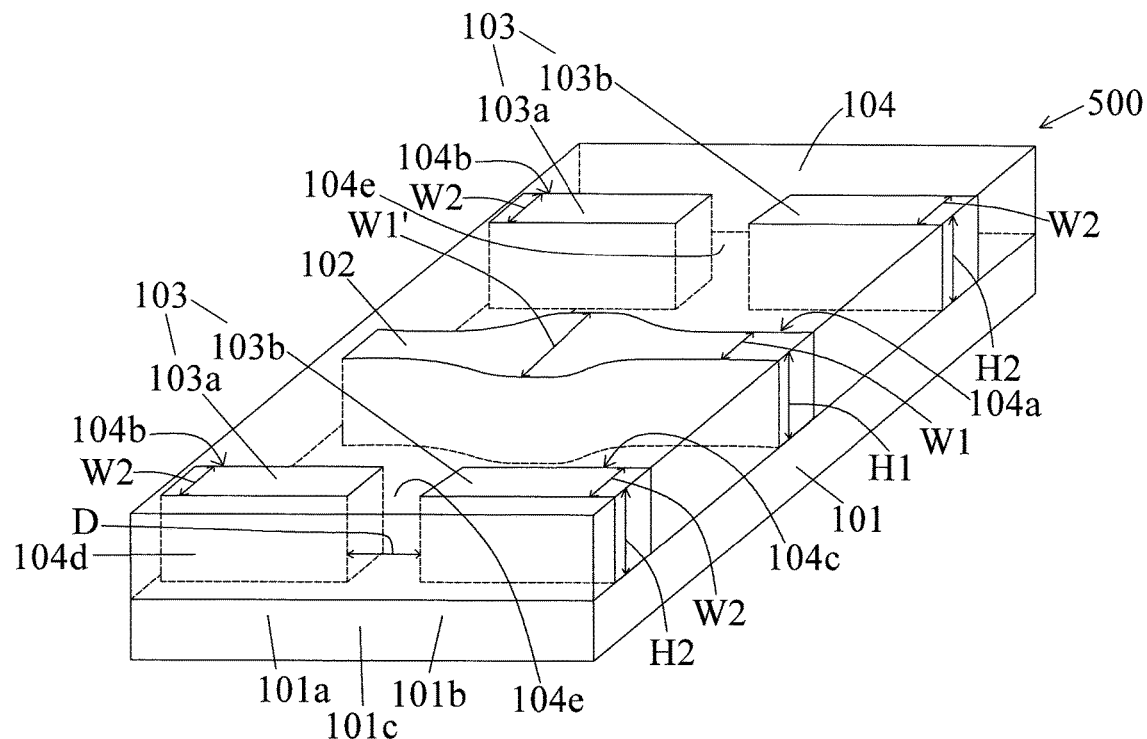
FIG. 11 is a schematic view of a semiconductor structure in accordance with some embodiments of the present disclosure.
Figure 12:
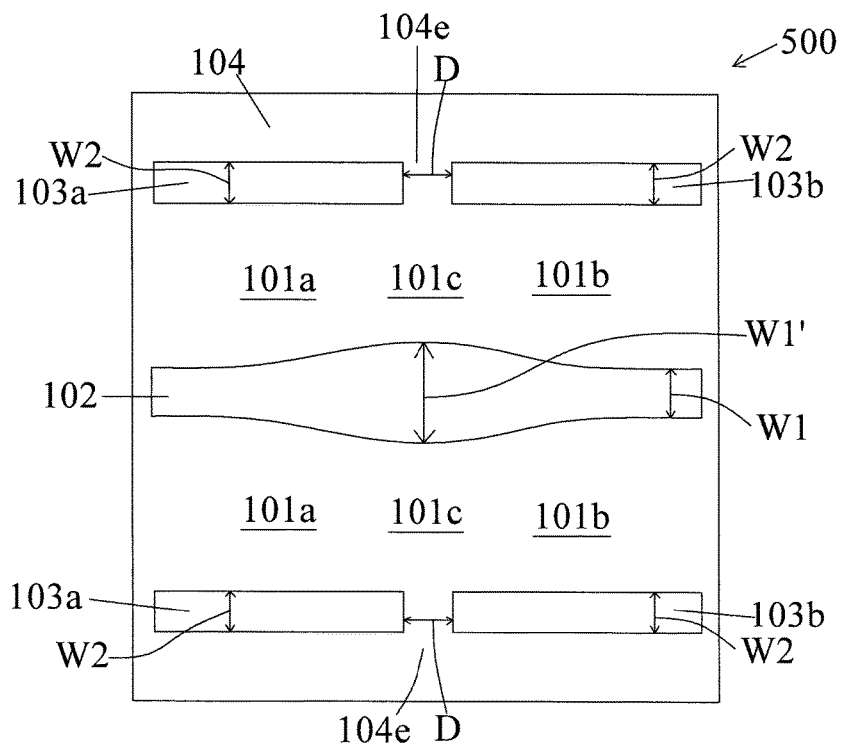
FIG. 12 is a top view of a semiconductor structure of FIG. 11 in accordance with some embodiments of the present disclosure.

FIG. 11 and FIG. 12 respectively are a semiconductor structure 500 in accordance with various embodiments of the present disclosure. FIG. 11 is a perspective view of the semiconductor structure 500, and FIG. 12 is a top plan view of the semiconductor structure 500. The semiconductor structure 500 has similar configuration as the semiconductor structure 200 of FIG. 5 and FIG. 6.

In some embodiments, the semiconductor structure 500 includes one or more second gates 103. As shown in FIG. 11 and FIG. 12, there are two second gates 103 surrounding the first gate 102. The two second gates 103 are interposed by the first gate 102. In some embodiments, two second gates 103 are in same configuration. In some embodiments, a portion of the first gate 102 with a greater width W1' is interposed between two portions 104e of the ILD 104.

Figure 13:
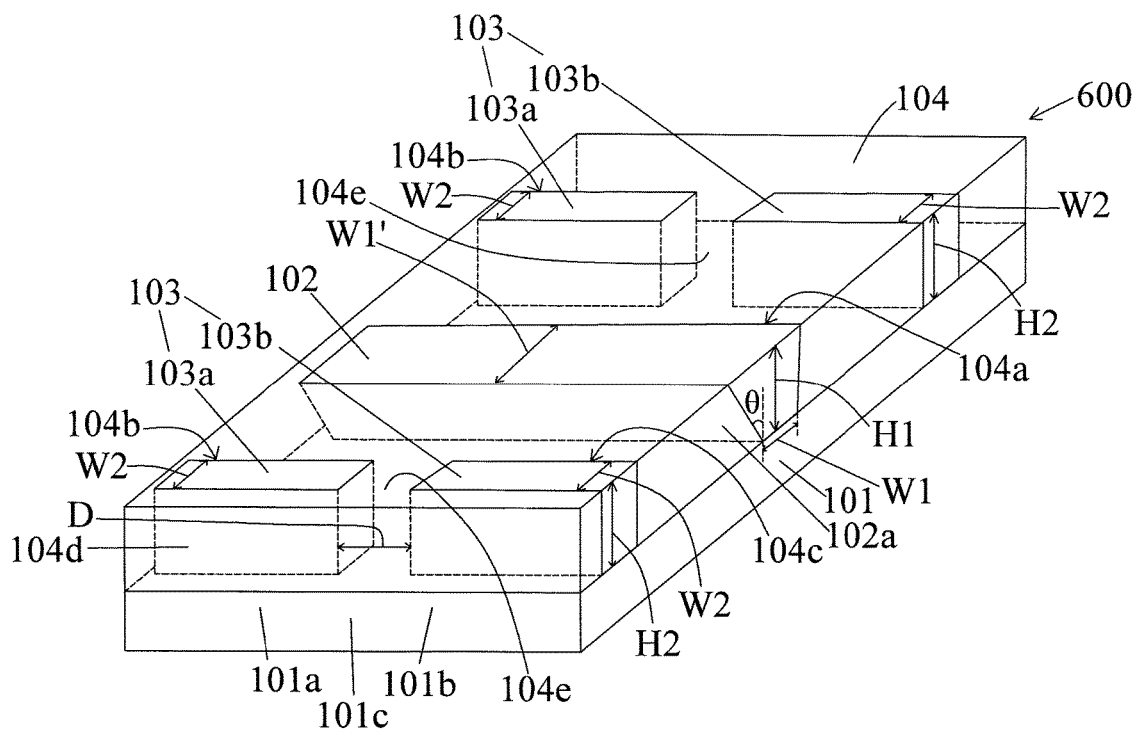
FIG. 13 is a schematic view of a semiconductor structure in accordance with some embodiments of the present disclosure.
Figure 14:
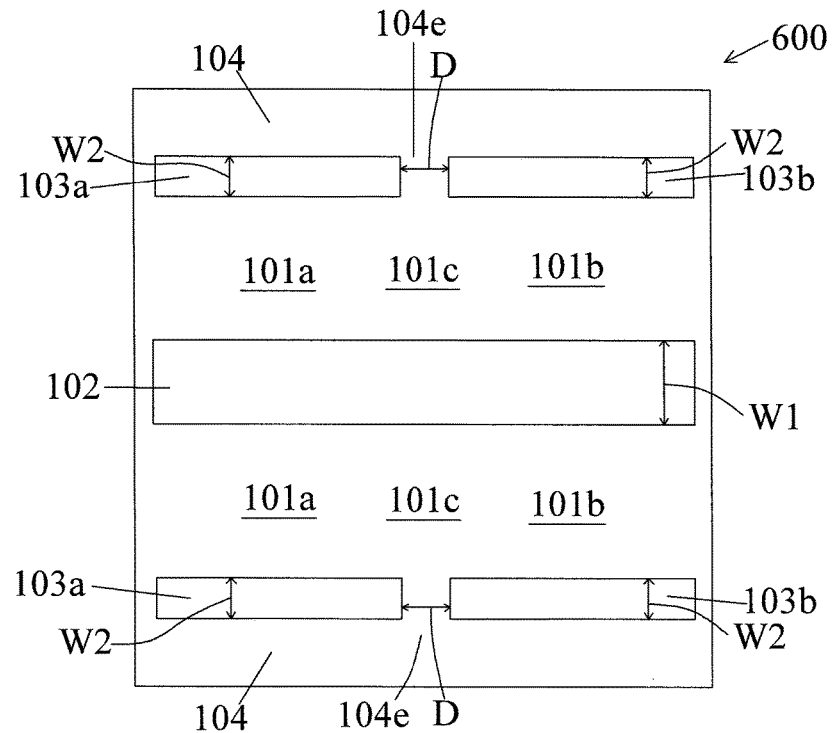
FIG. 14 is a top view of a semiconductor structure of FIG. 13 in accordance with some embodiments of the present disclosure.

FIG. 13 and FIG. 14 respectively are a semiconductor structure 600 in accordance with various embodiments of the present disclosure. FIG. 13 is a perspective view of the semiconductor structure 600, and FIG. 14 is a top plan view of the semiconductor structure 600. The semiconductor structure 600 has similar configuration as the semiconductor structure 300 of FIG. 7 and FIG. 8.

In some embodiments, the semiconductor structure 600 includes one or more second gates 103. As shown in FIG. 13 and FIG. 14, there are two second gates 103 surrounding the first gate 102. The two second gates 103 are interposed by the first gate 102. In some embodiments, two second gates 103 are in same configuration. In some embodiments, the width W1' of the first gate 102 is substantially greater than the width W2 of one of the second gates 103.

Figure 15:
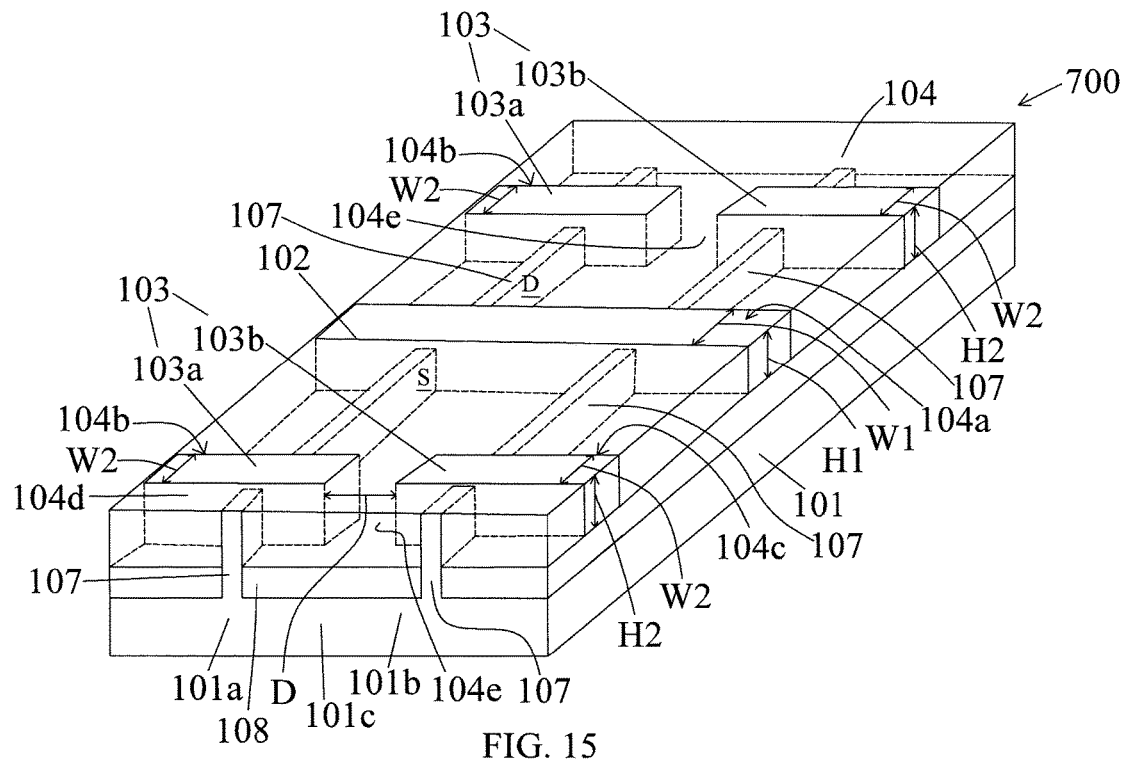
FIG. 15 is a schematic view of a semiconductor structure in accordance with some embodiments of the present disclosure.
Figure 16:
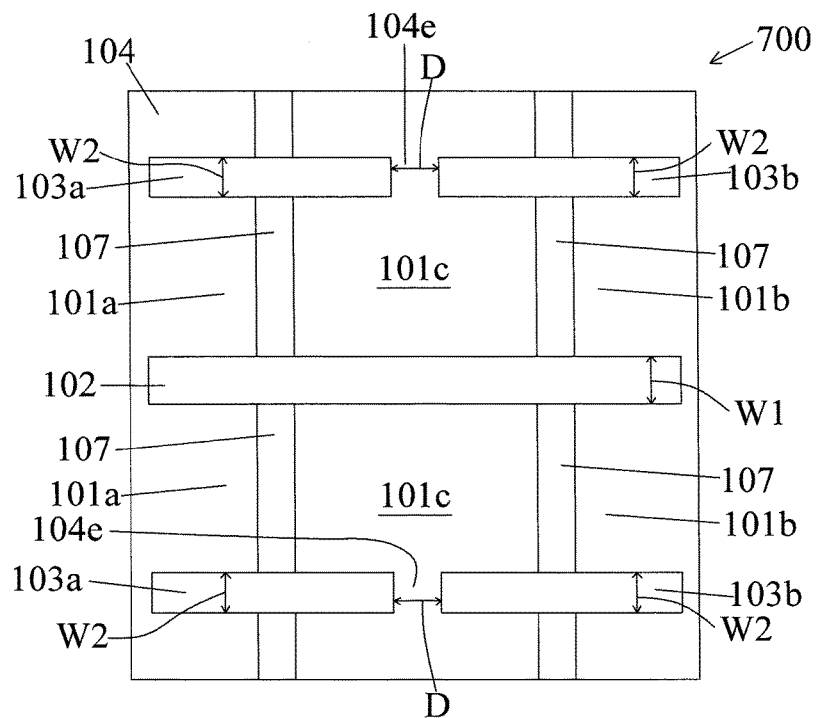
FIG. 16 is a top view of a semiconductor structure of FIG. 15 in accordance with some embodiments of the present disclosure.

FIG. 15 and FIG. 16 respectively are a semiconductor structure 700 in accordance with various embodiments of the present disclosure. FIG. 15 is a perspective view of the semiconductor structure 600, and FIG. 16 is a top plan view of the semiconductor structure 700. The semiconductor structure 700 has similar configuration as the semiconductor structure 100 of FIG. 3 and FIG. 4.

In some embodiments, the semiconductor structure 700 is a FinFET (fin field effect transistor). In some embodiments, the substrate 101 of the semiconductor structure 700 includes several semiconductor fins 107. The semiconductor fin 107 is disposed over the first active region 101a or the second active region 101b. The semiconductor fin 17 is extended between the first gate 102 and the second gate 103 over the first active region 101a or the second active region 101b. The semiconductor fin 107 is across the first gate 102 and the second gate 103. In some embodiments, the semiconductor fins 107 are surrounded by the ILD 104. In some embodiments, the semiconductor fins 107 are separated by shallow trench isolation (STI) 108.

In some embodiments, the semiconductor fin 107 includes silicon or silicon germanium. In some embodiments, the semiconductor fin 107 includes various doped regions comprising lightly doped source/drain (LDD) regions and source/drain (S/D) regions (also referred to as heavily doped S/I) regions). The S/D regions are doped with p-type dopants, such as boron or BF2; n-type dopants, such as phosphorus or arsenic. In some embodiments, the source region and the drain region of each of the plurality of fins are interposed by the first gate or the second gate. In some embodiments, each of the semiconductor fins 107 has a height of about 10 mm to about 30 nm and a width of about 10 nm to about 25 nm.

Figure 17:
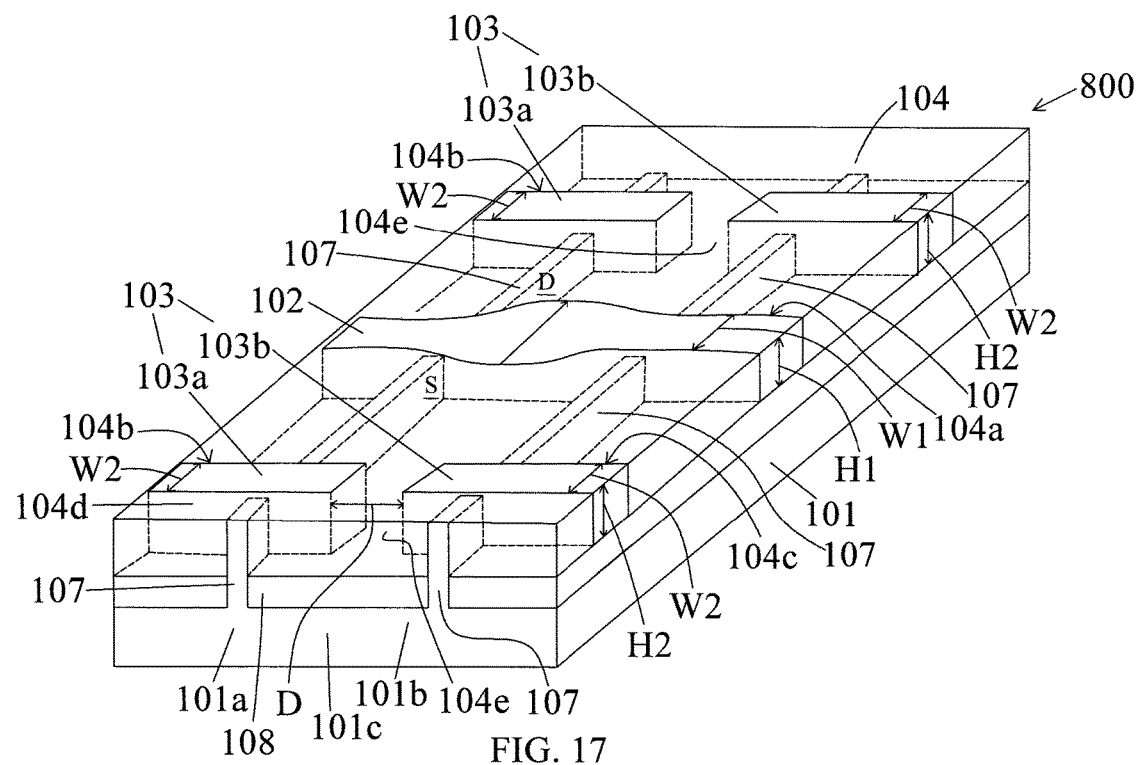
FIG. 17 is a schematic view of a semiconductor structure in accordance with some embodiments of the present disclosure.
Figure 18:
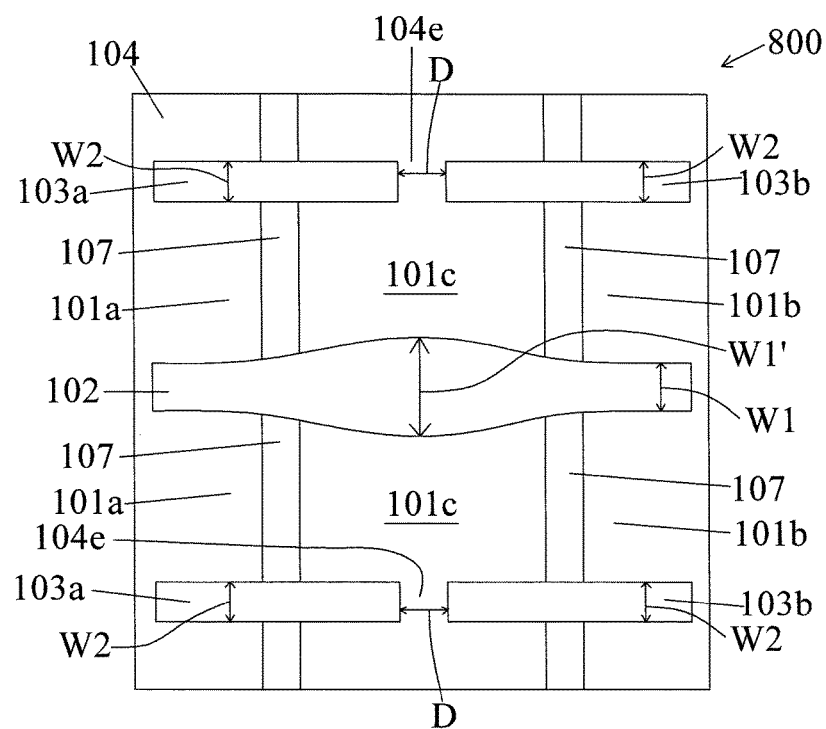
FIG. 18 is a top view of a semiconductor structure of FIG. 17 in accordance with some embodiments of the present disclosure.

FIG. 17 and FIG. 18 respectively are a semiconductor structure 800 in accordance with various embodiments of the present disclosure. FIG. 17 is a perspective view of the semiconductor structure 800, and FIG. 18 is a top plan view of the semiconductor structure 800. The semiconductor structure 800 has similar configuration as the semiconductor structure 100 of FIG. 3 and FIG. 4. The semiconductor structure 800 is a FinFET and includes several semiconductor fins 107. The semiconductor structure 800 has similar configuration as the semiconductor structure 700 of in FIGS. 15 and 16.

Figure 19:
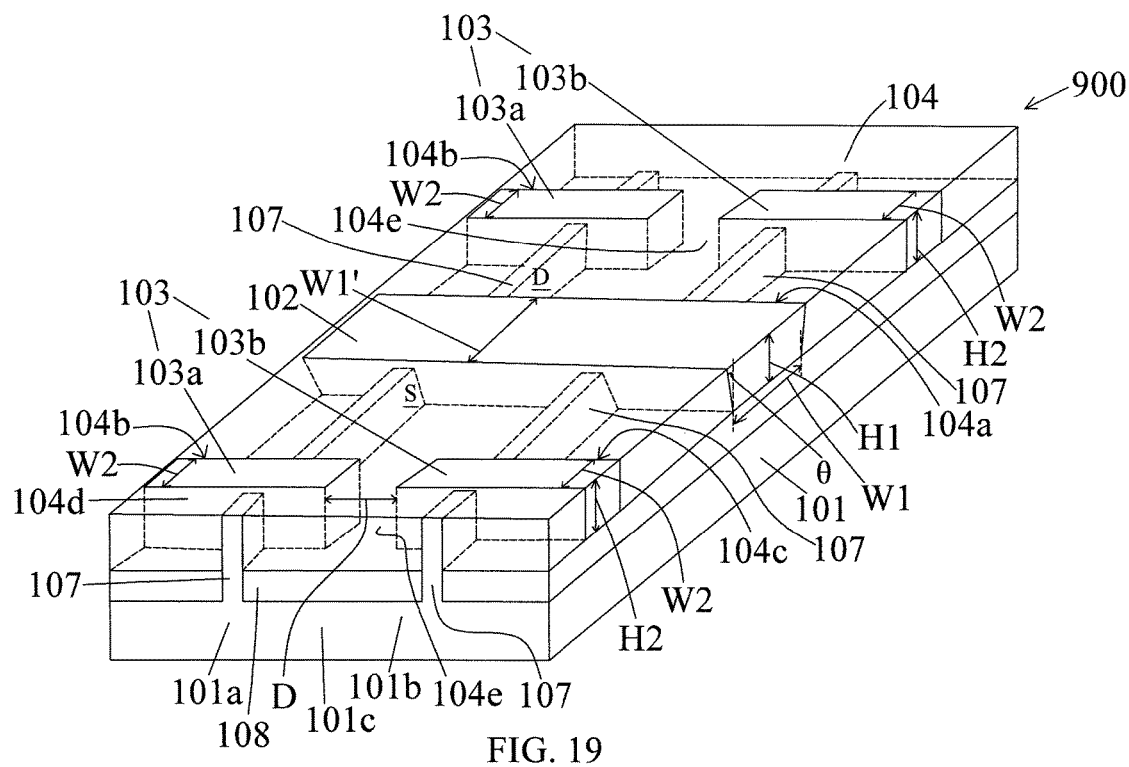
FIG. 19 is a schematic view of a semiconductor structure in accordance with some embodiments of the present disclosure.
Figure 20:
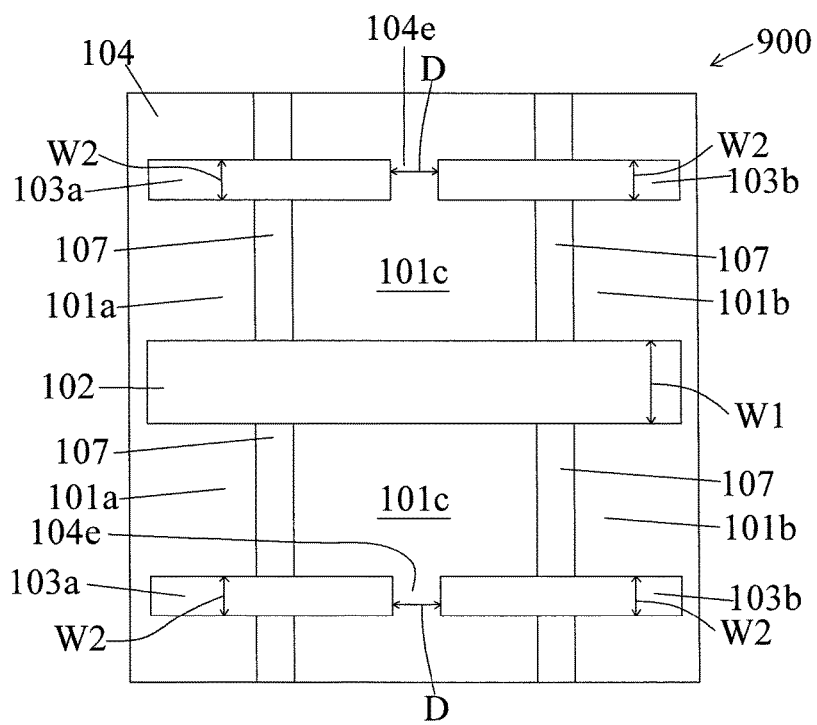
FIG. 20 is a top view of a semiconductor structure of FIG. 19 in accordance with some embodiments of the present disclosure.

FIG. 19 and FIG. 20 respectively are a semiconductor structure 800 in accordance with various embodiments of the present disclosure. FIG. 19 is a perspective view of the semiconductor structure 900, and FIG. 20 is a top plan view of the semiconductor structure 900. The semiconductor structure 900 is also a FinFET with several semiconductor fins 107, similar to the semiconductor structure 700 of in FIGS. 15 and 16.

In the present disclosure, a method of manufacturing a semiconductor structure is also disclosed. In some embodiments, a semiconductor structure is formed by a method 1000. The method 1000 includes a number of operations and the description and illustration are not deemed as a limitation as the sequence of the operations.

Figure 21:
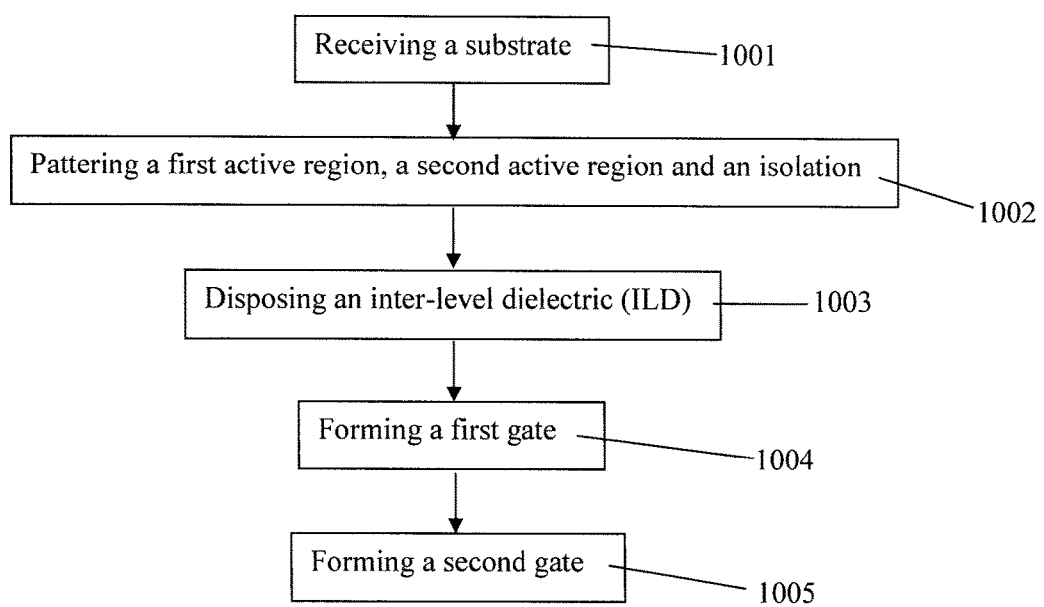
FIG. 21 is a flow diagram of a method of manufacturing a semiconductor structure in accordance with some embodiments of the present disclosure.

FIG. 21 is a diagram of a method 1000 of manufacturing a semiconductor device in accordance with various embodiments of the present disclosure. The method 1000 includes a number of operations (1001, 1002, 1003, 1004 and 1005).

Figure 21A:
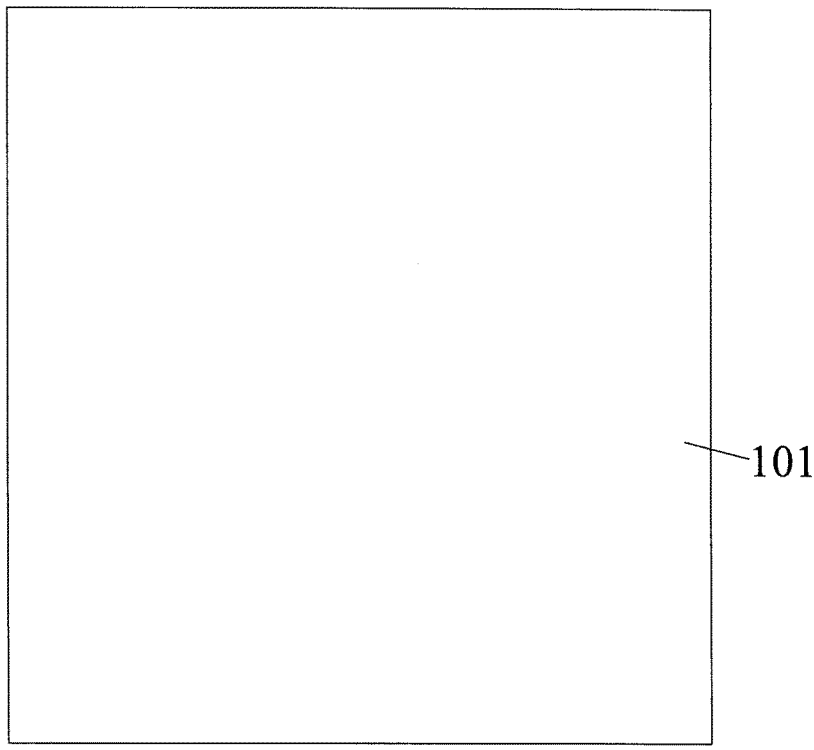
FIGS. 21A, 21B, 21C, 21D, 21E, 21F, 21G, 21H, 21I, 21J, 21K, 21L, 21M, 21N, 21O, 21P, 21Q, 21R, 21S, 21T, 21U, 21V, 21W, 21X, 21Y, 21Z, 21AA, 21AB, 21AC, 21AD, 21AE, and 21AF are schematic views of showing the manufacturing of a semiconductor structure in accordance with some embodiments of the present disclosure.

In operation 1001, a substrate 101 is received or provided as in FIG. 21A. In some embodiments, the substrate 101 includes silicon, germanium, silicon germanium, gallium arsenic or other suitable semiconductor materials. In some embodiments, the substrate 101 has similar configuration as the substrate 101 in one of FIGS. 3-20.

Figure 21B:
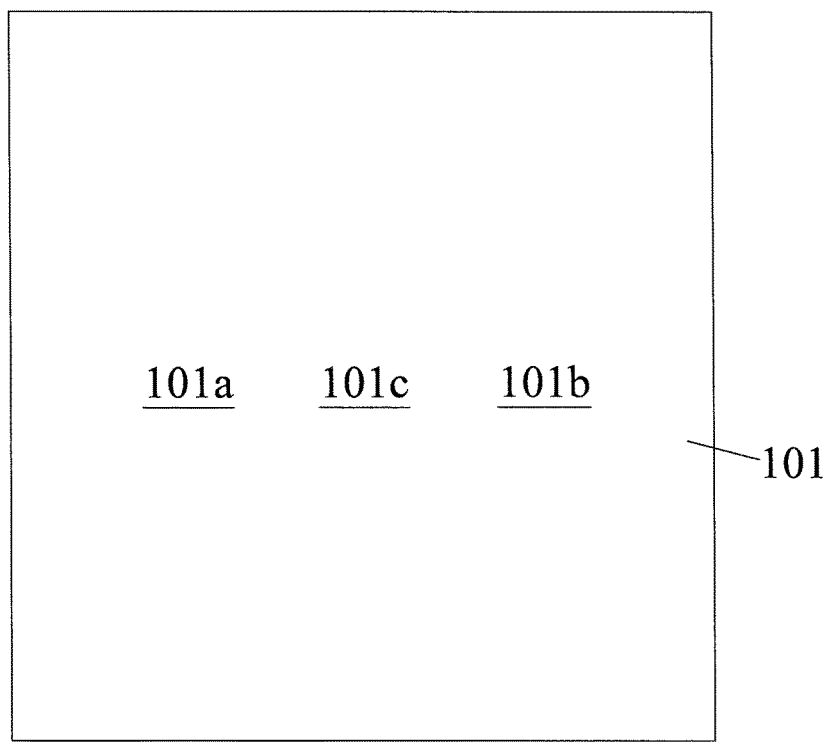

In operation 1002, a first active region 101a, a second active region 101b and an isolation 101c disposed between the first active region 101a and the second active region 101b are patterned as in FIG. 21B. In some embodiments, the first active region 101a and the second active region 101b are formed by various doping operations, depending on design requirements. In some embodiments, the first active region 101a or the second active region 101b is doped with n-typed dopants or p-typed dopants. In some embodiments, the isolation 101c is formed by pattering the substrate 101 through photolithography operation, forming a trench in the substrate 101 through dry etching, wet etching or plasma etching operation, and filing the trench by a dielectric material. In some embodiments, the first active region 101a, the second active region 101b and the isolation 101c are configured as in one of FIGS. 3-14. In some embodiments, the first active region 101a, the second active region 101b and the isolation 101c are patterned upon the receipt or provision of the substrate 101 (the operation 1001).

Figure 21C:
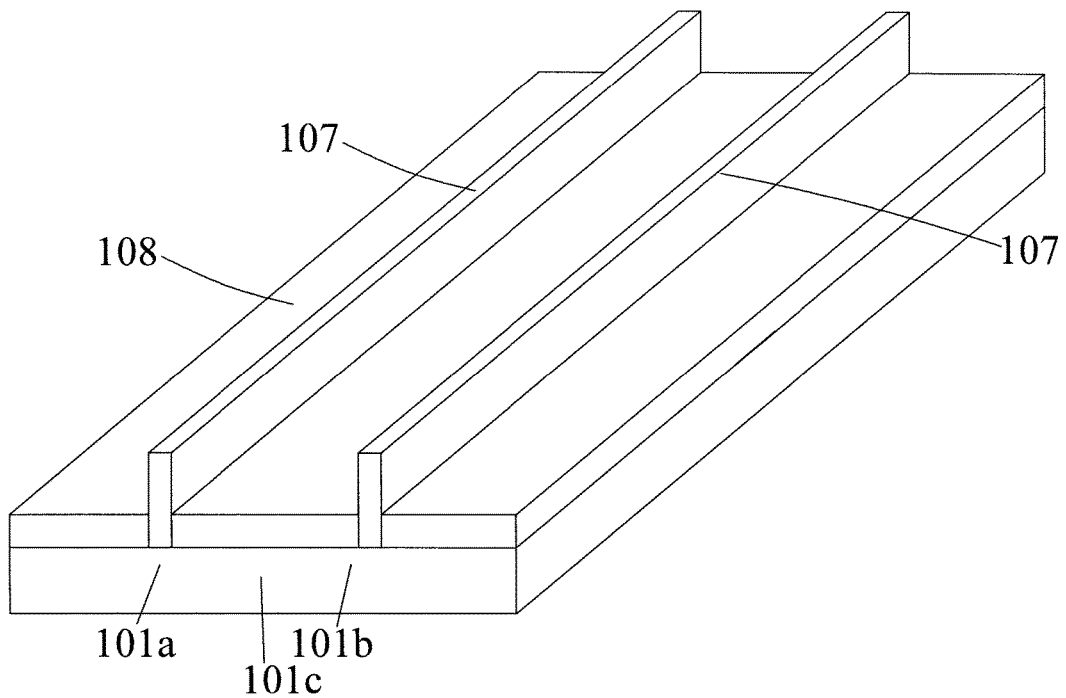
Figure 21D:
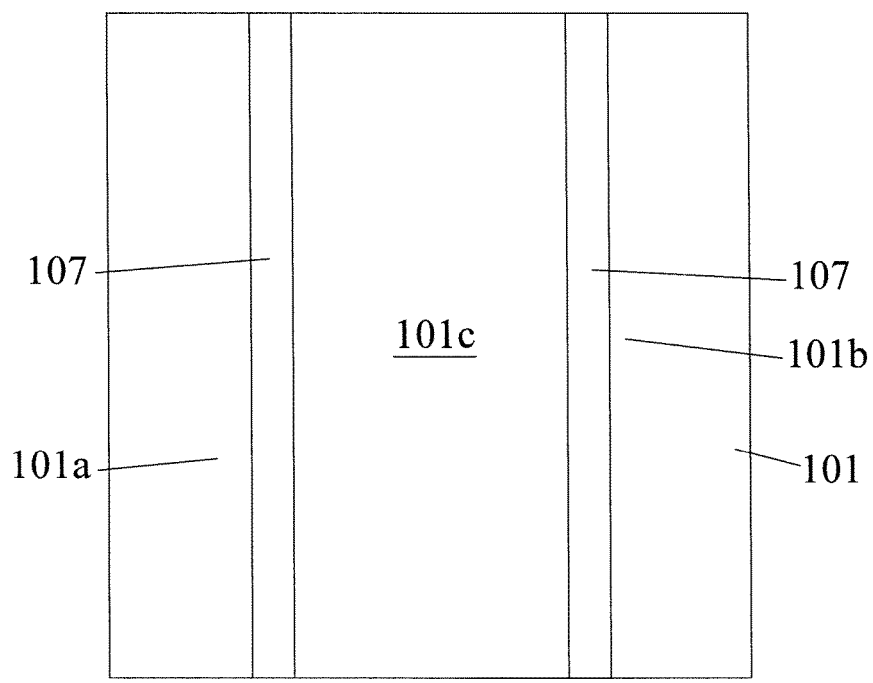
Figure 21E:
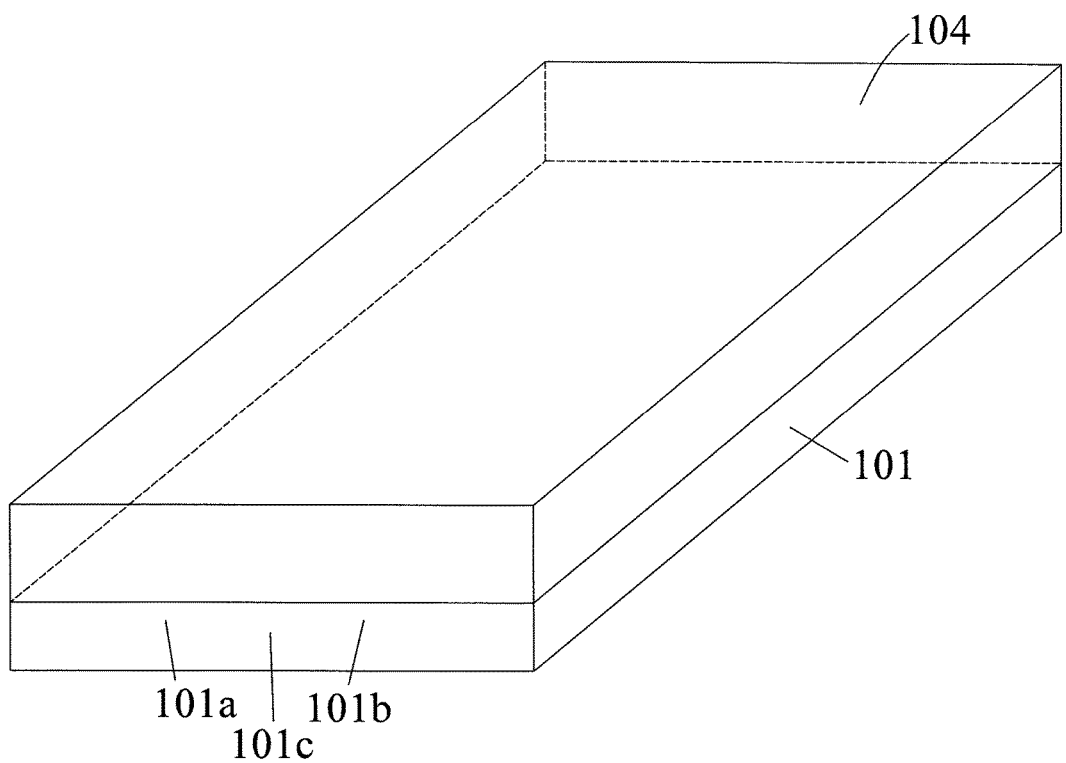
Figure 21F:
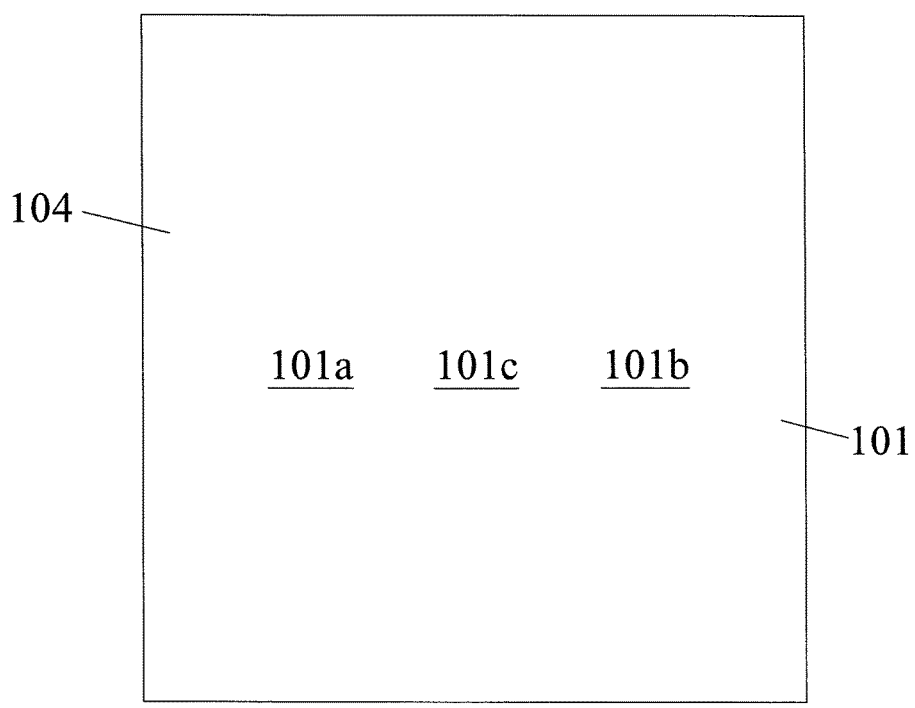
Figure 21G:
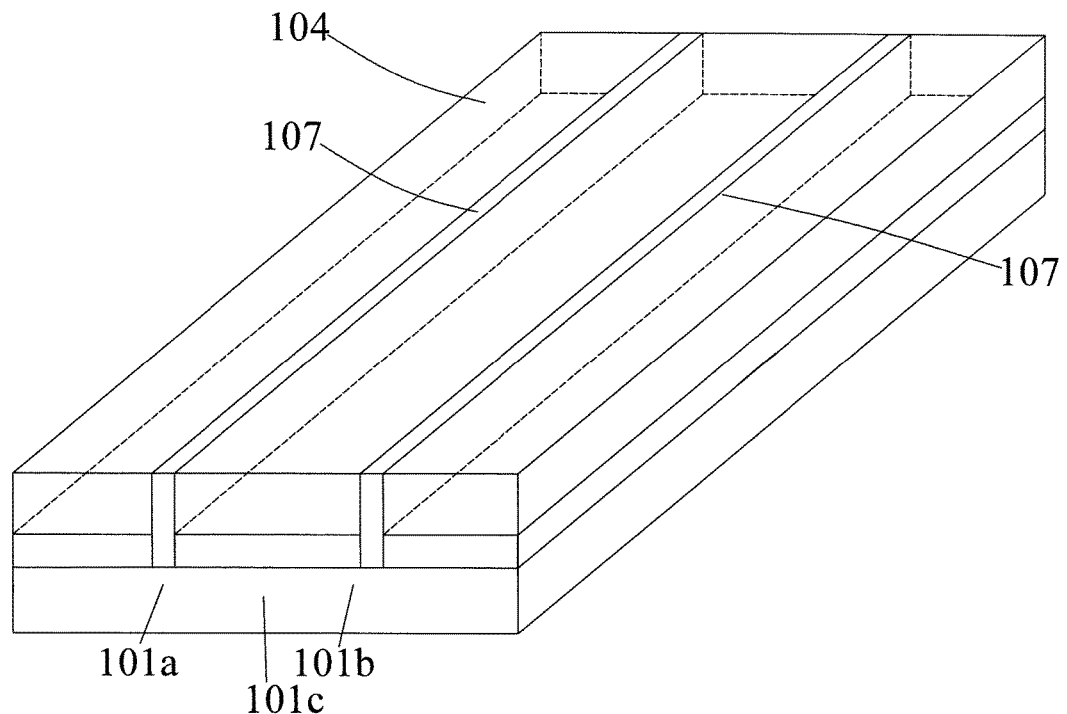
Figure 21H:
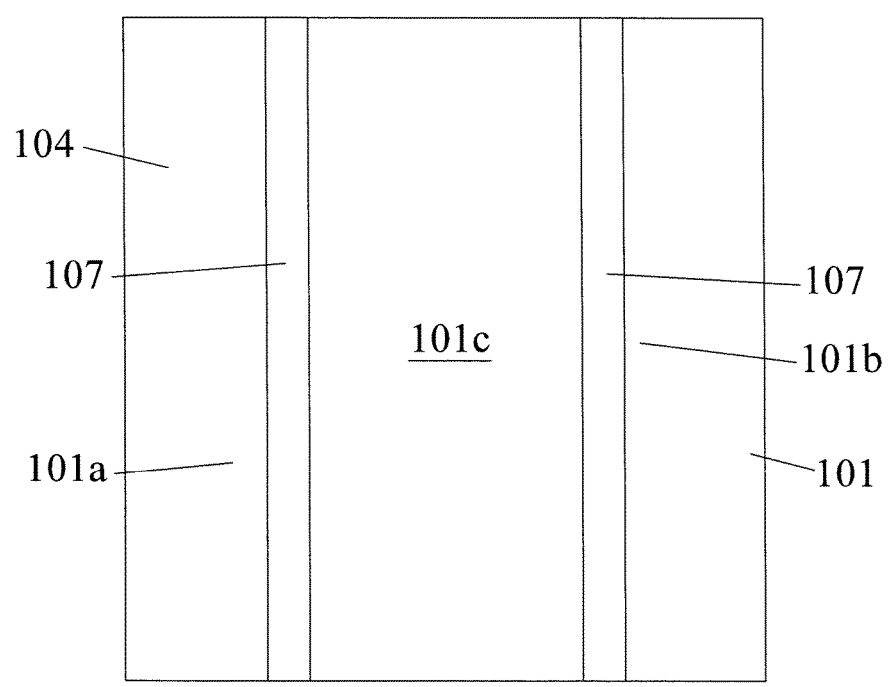
Figure 21I:
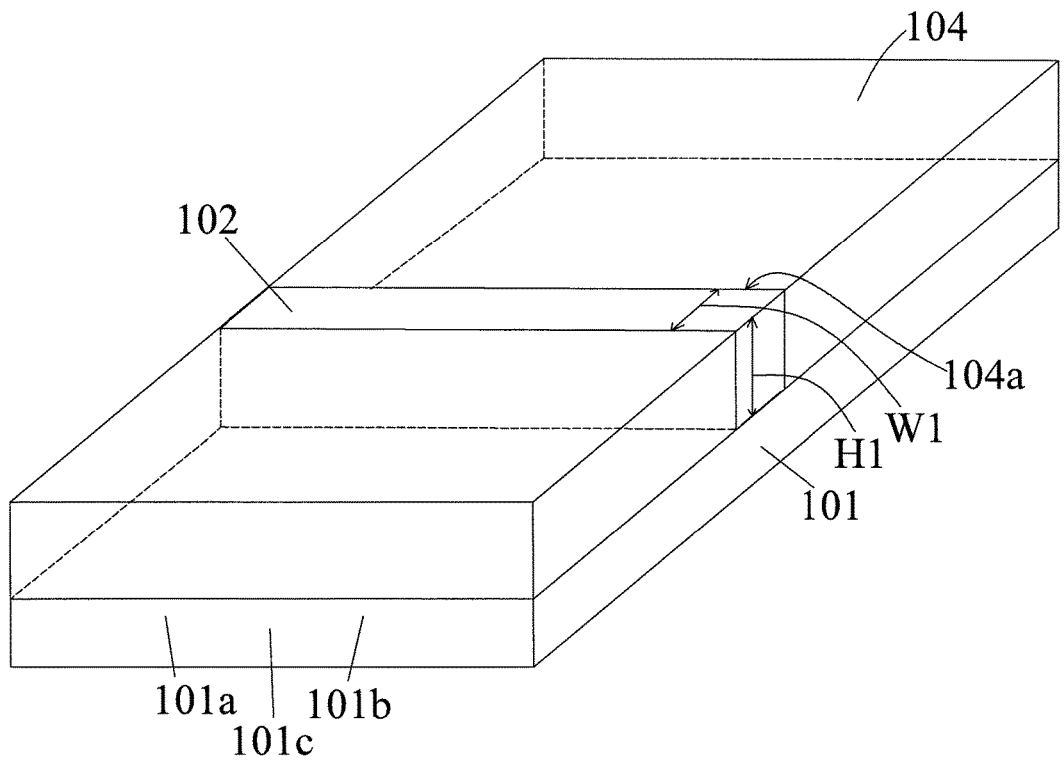
Figure 21J:
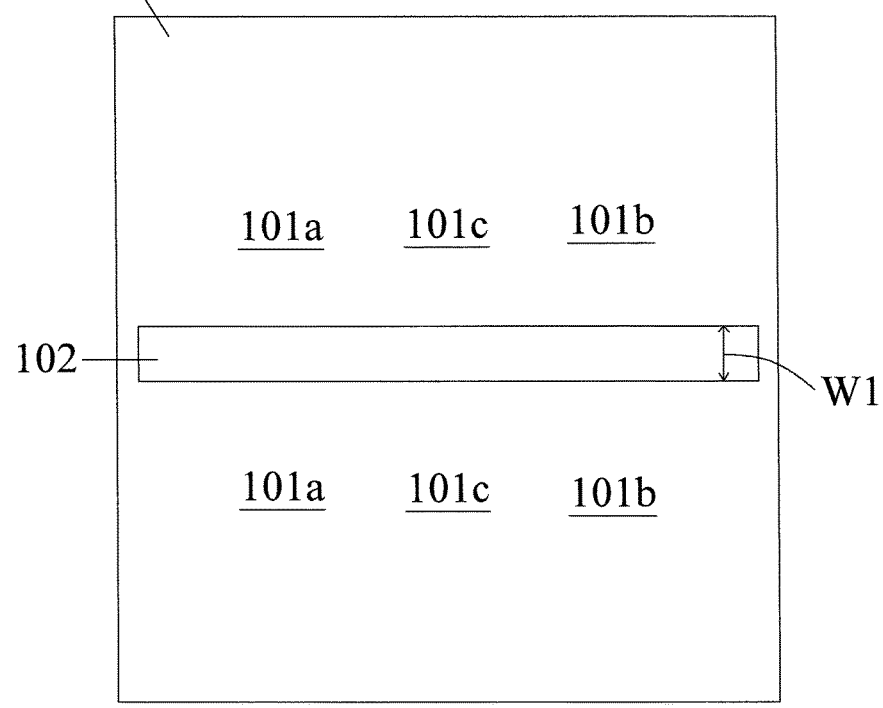
Figure 21K:
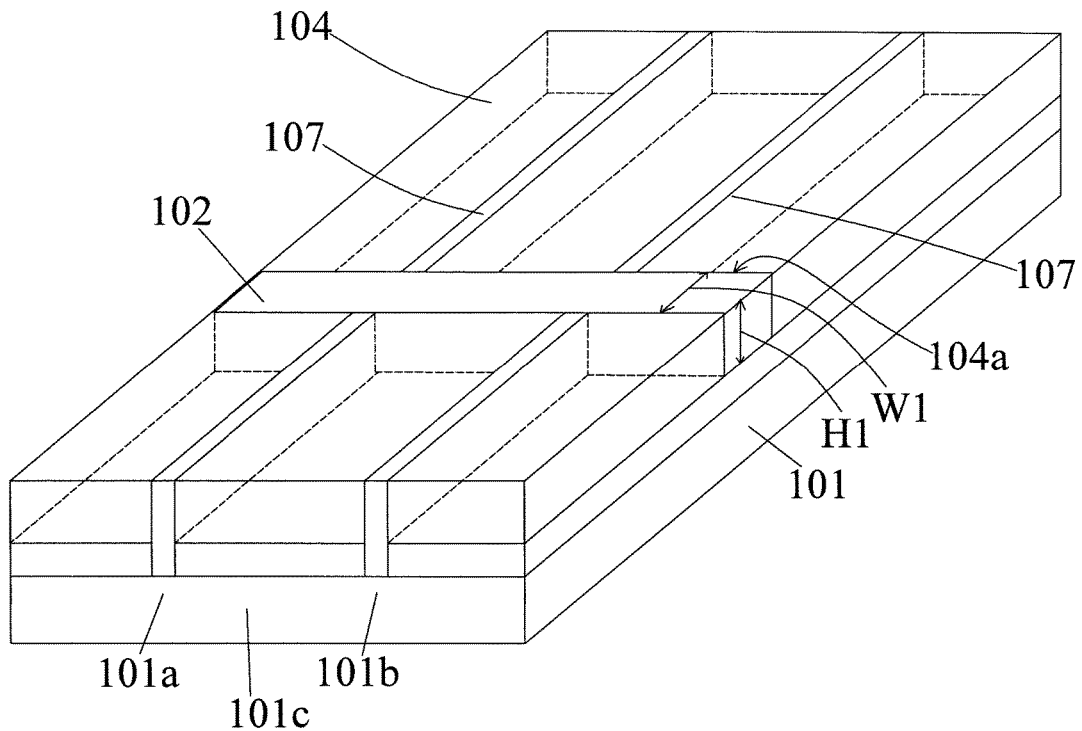
Figure 21L:
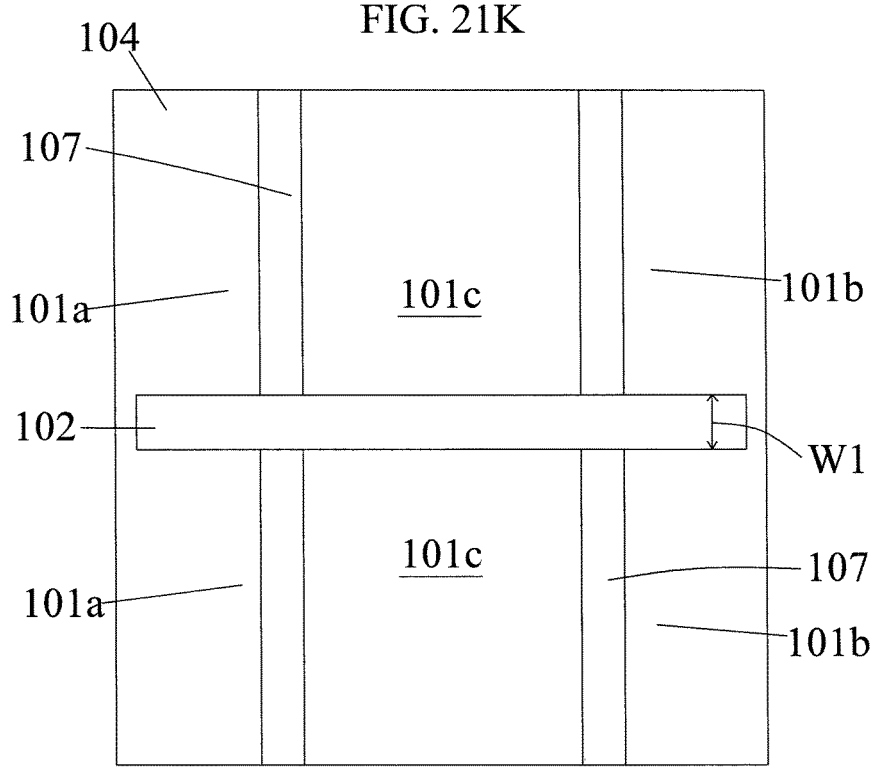
Figure 21M:
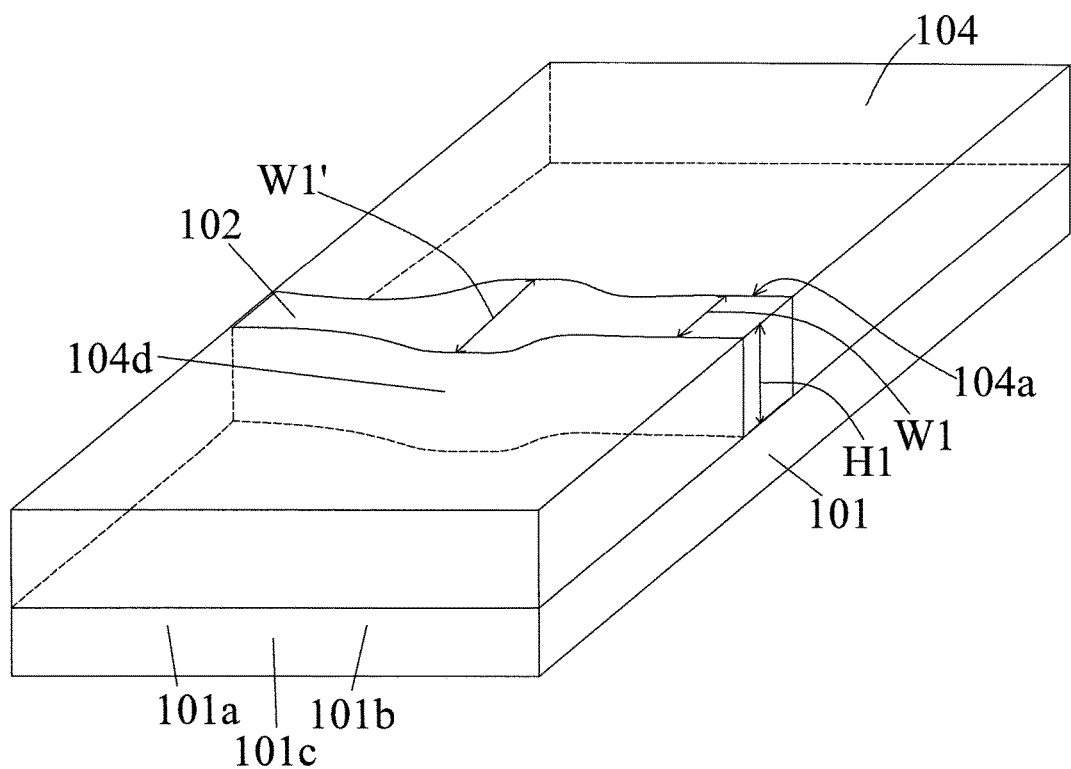
Figure 21N:
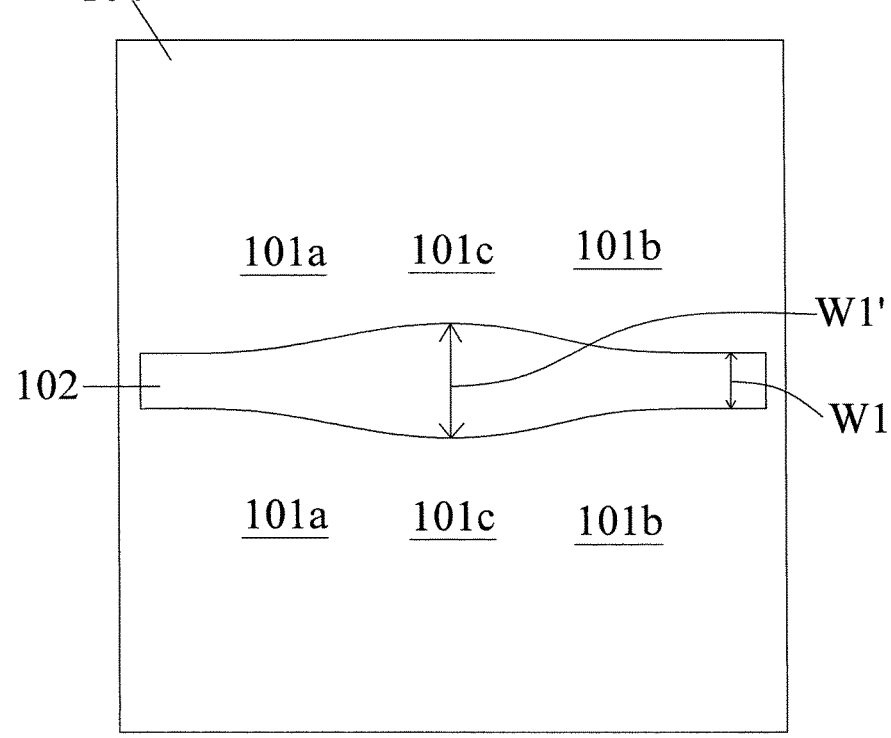
Figure 21O:
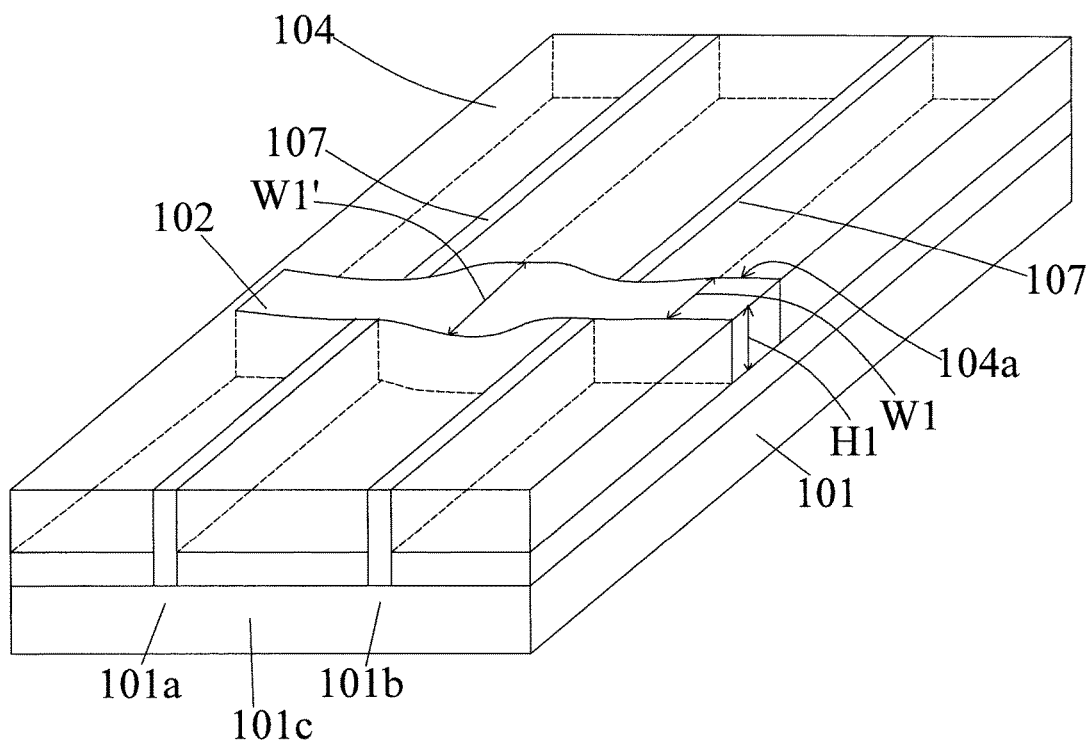
Figure 21P:
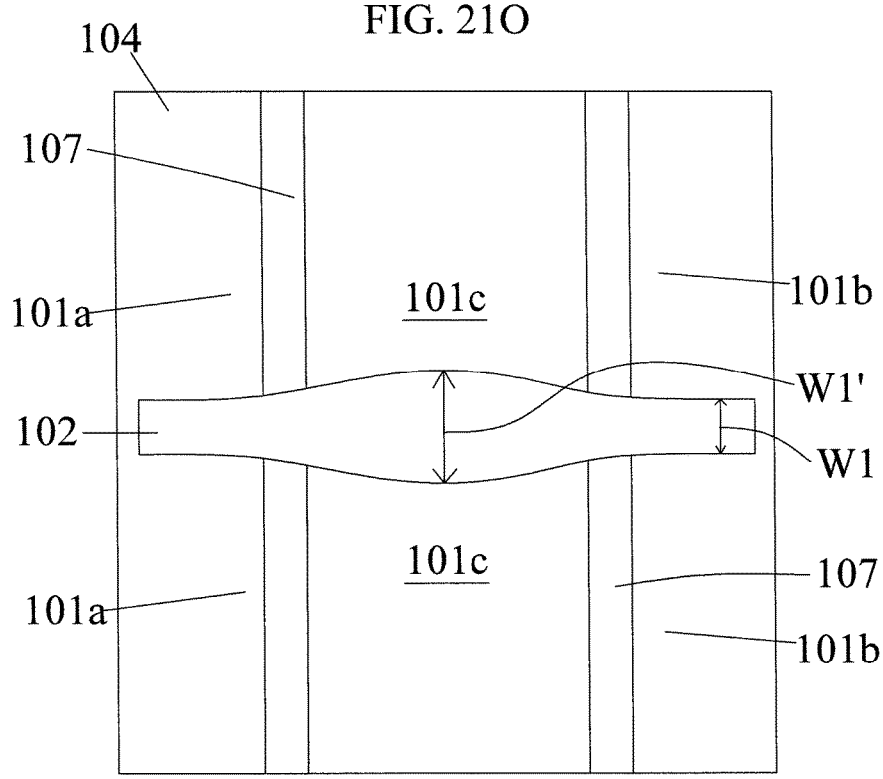
Figure 21Q:
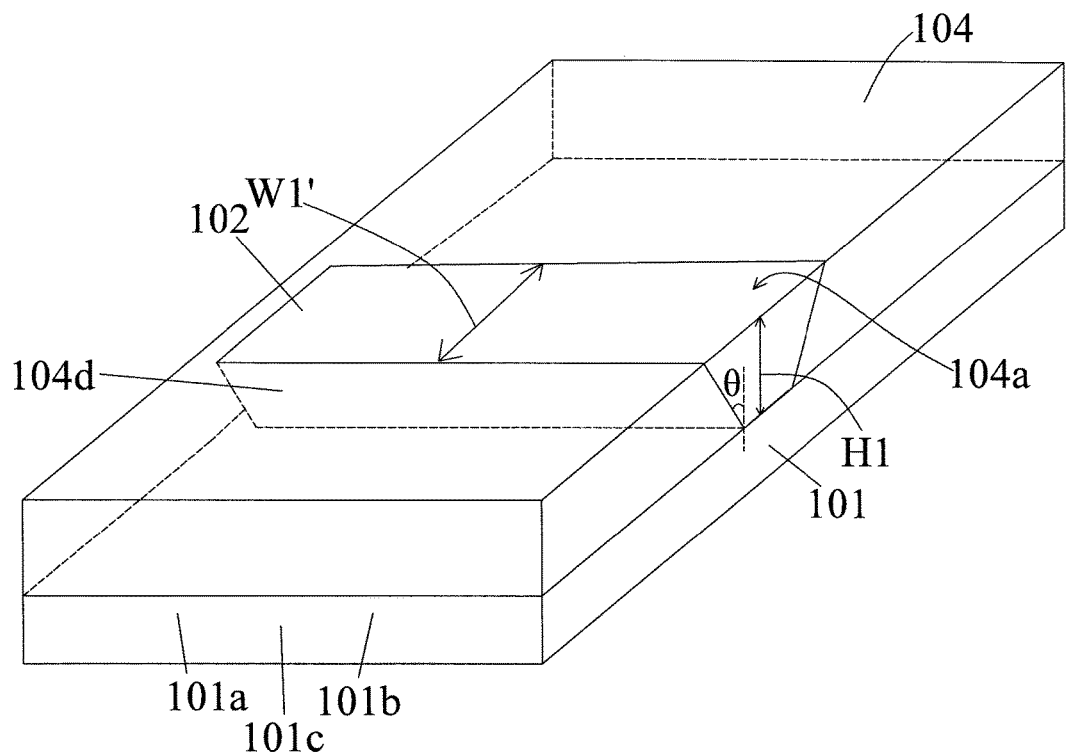
Figure 21R:
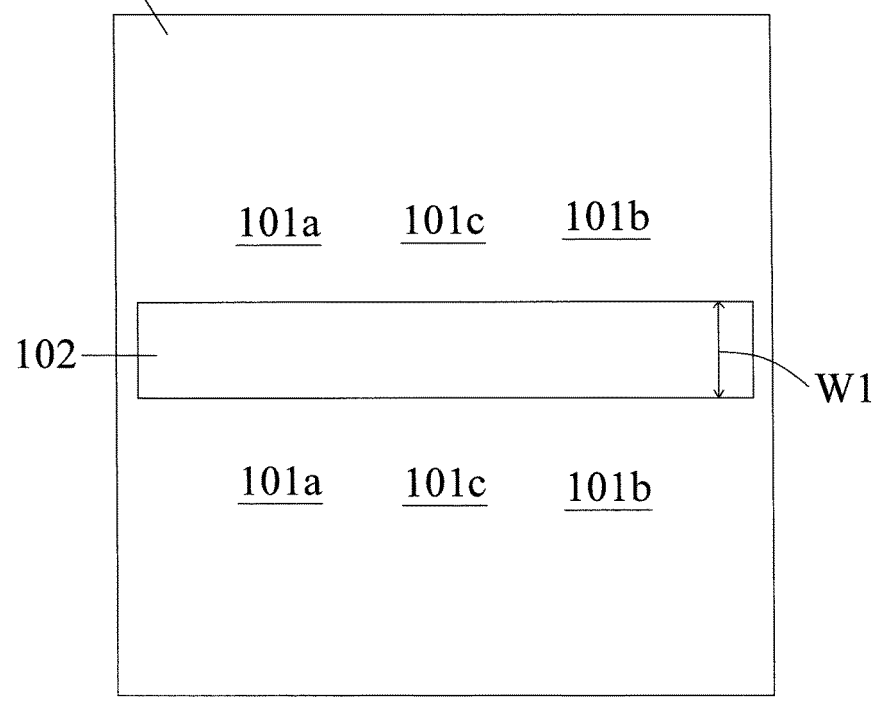
Figure 21S:
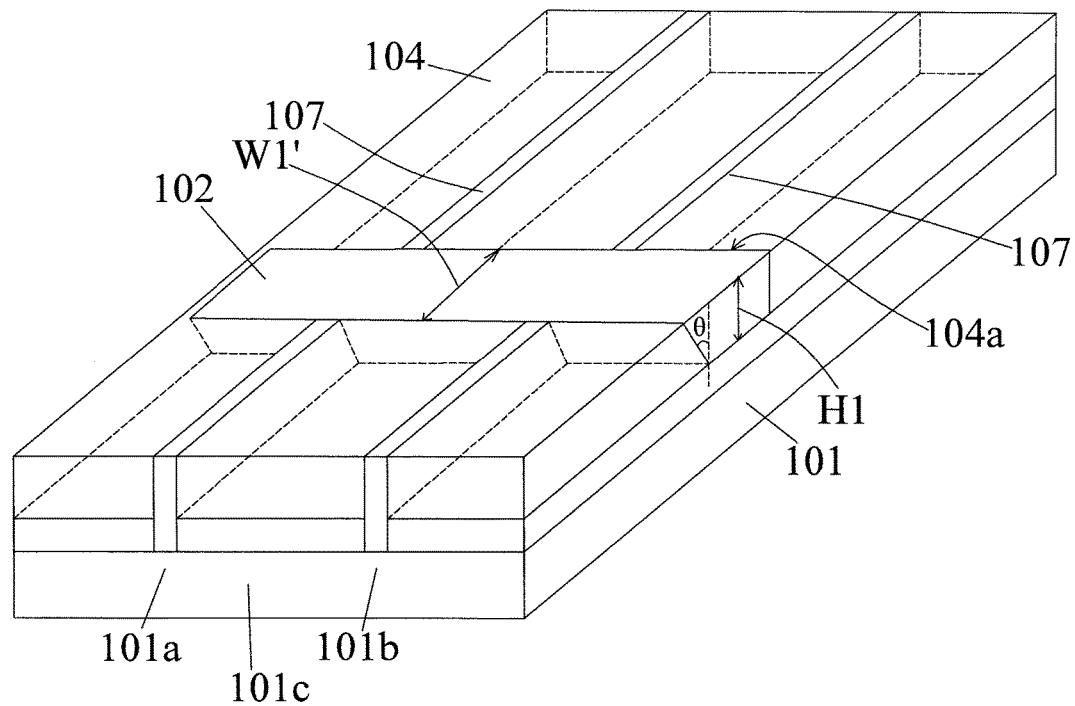
Figure 21T:
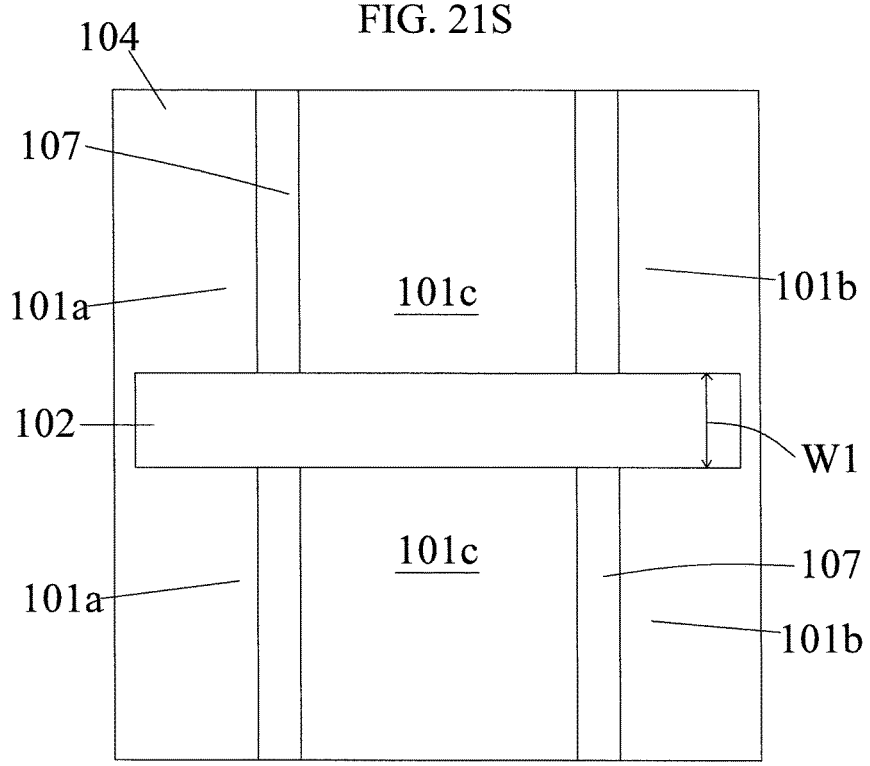

In some embodiments for forming a semiconductor structure as a FinFET, the substrate 101 is patterned with the first active region 101a, the second active region 101b, the isolation 101c and several fins 107 as in FIG. 21C and FIG. 21D. In some embodiments, the fins 107 are patterning by hardmask deposition and reactive ion etching (RIE) operations. In some embodiments, the first active region 101a, the second active region 101b, the isolation 101c and the fins 107 are configured as in one of FIGS. 15-20. In some embodiments, the semiconductor fins 107 are separated by shallow trench isolation (STI) 108.

In operation 1003, an inter-level dielectric (ILD) 104 is disposed over the substrate 101 as in FIGS. 21E-21H. In some embodiments, the ILD 104 includes a dielectric material. In some embodiments, the ILD 104 includes silicon oxide, silicon dioxide, silicon oxynitride, silicon oxynitride doped with hydrogen or silicon oxide doped with carbon. In some embodiments as in FIG. 21G and FIG. 21H, the ILD 104 is disposed around the fins 107. In some embodiments, the ILD 104 has similar configuration as in one of FIGS. 3-20.

In operation 1004, a first gate 102 is formed as in FIGS. 21I-21T. In some embodiments, the first gate 102 is extended over the first active region 101a, the isolation 101c and the second active region 101b. In some embodiments, the first gate 102 includes a gate fill metal.

In some embodiments, the formation of the first gate 102 includes forming a first recess 104a of the ILD 104. In some embodiments, the first recess 104a is formed by any suitable operations such as etching. The first recess 104a is formed through the ILD 104 and is extended over the first active region 101a, the second active region 101b and the isolation 101. In some embodiments, the first recess 104a is in a high aspect ratio of greater than about 10. In some embodiments, the first recess 104a is filled by a polysilicon and then is annealed at a predetermined temperature of about 200 degree Celsius to about 800 degree Celsius.

In some embodiments as in FIGS. 21M-21T, the polysilicon within the first recess 104a is removed from the first recess 104a, thereby a width of a portion or a whole of the first recess 104a is increased. In some embodiments, the removal of the polysilicon from the first recess 104a includes pulling a sidewall 104d of the first recess 104a to increase the width of the portion of the first recess 104a. In some embodiments, the width of the first recess 104a is increased from W1 (as in FIGS. 21I-21L) to W1' (as in FIGS. 21M-21T). In some embodiments, the sidewall 104d of the first recess 104a is tilted in an angle θ when the polysilicon is removed from the first recess 104a. The angle θ between the sidewall 104d and an axis orthogonal to the substrate 101 is about 1° to about 10°. After the polysilicon is removed from the first recess 104a, the first recess 104a is filled by the gate fill metal. As a result, the first gate 102 is formed.

Figure 21U:
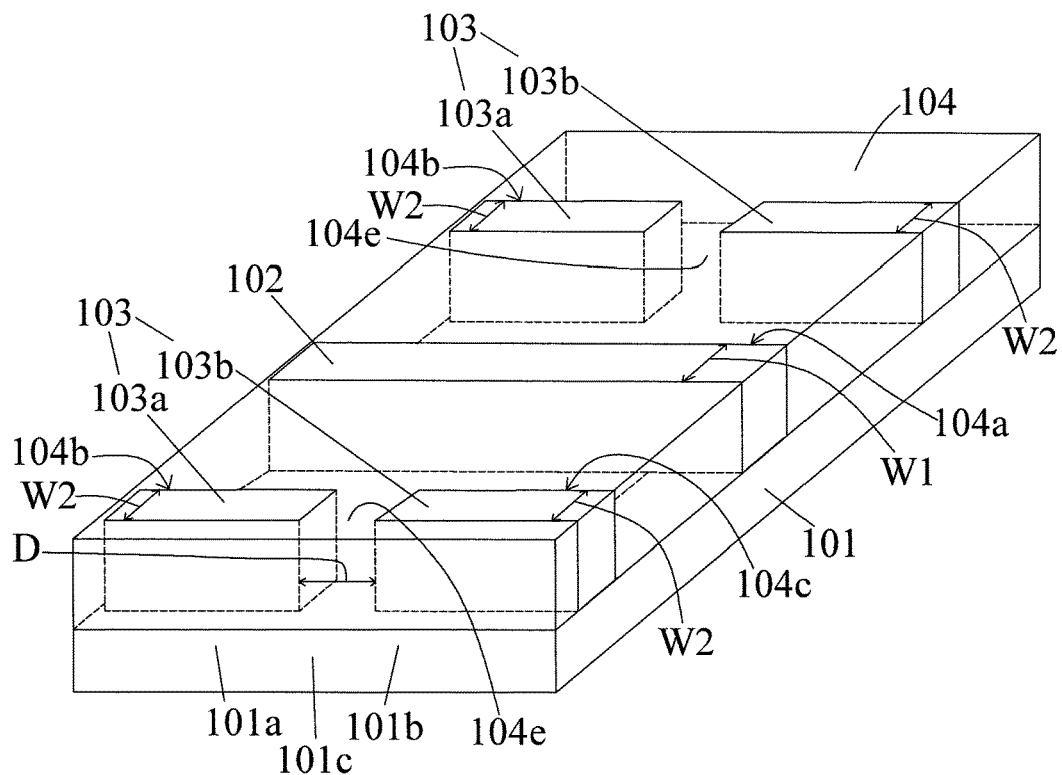
Figure 21V:
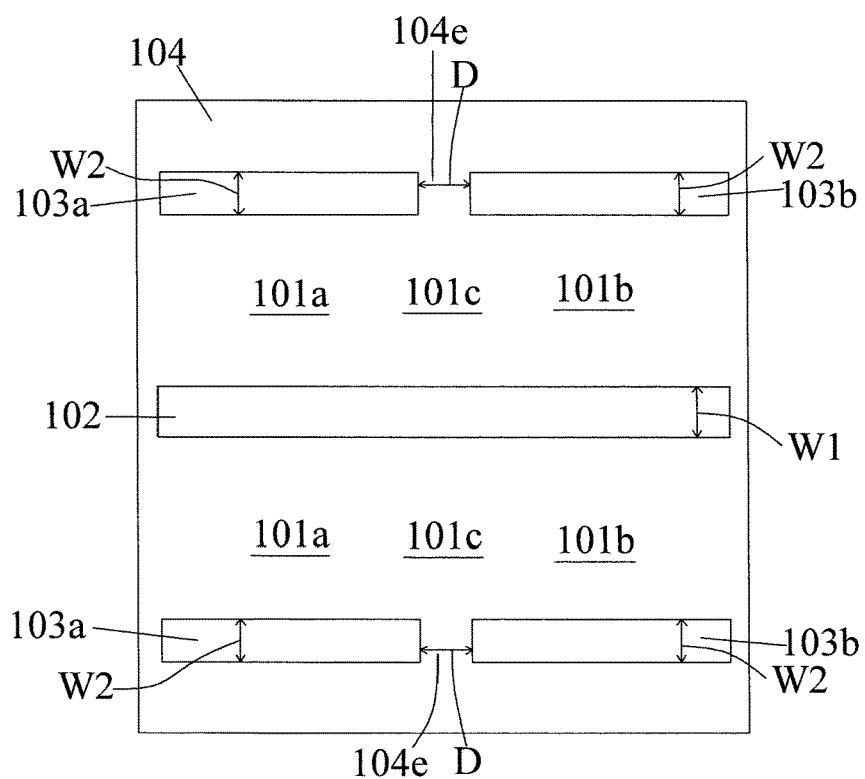
Figure 21W:
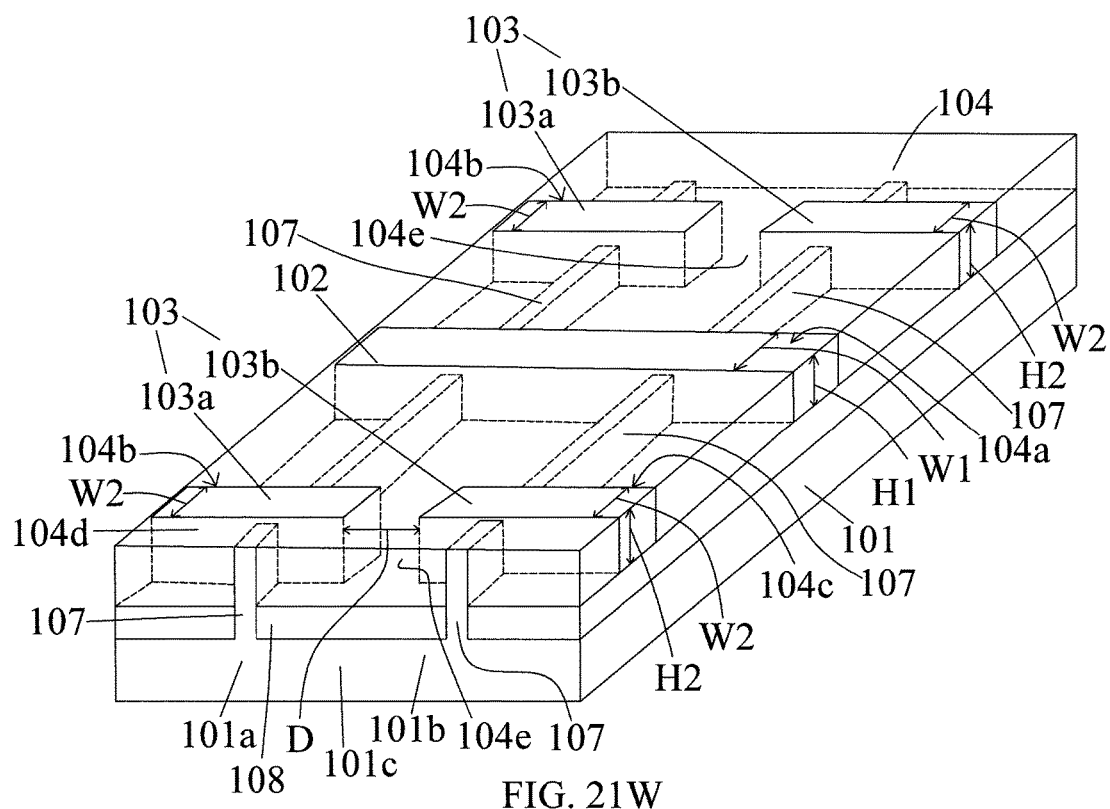
Figure 21X:
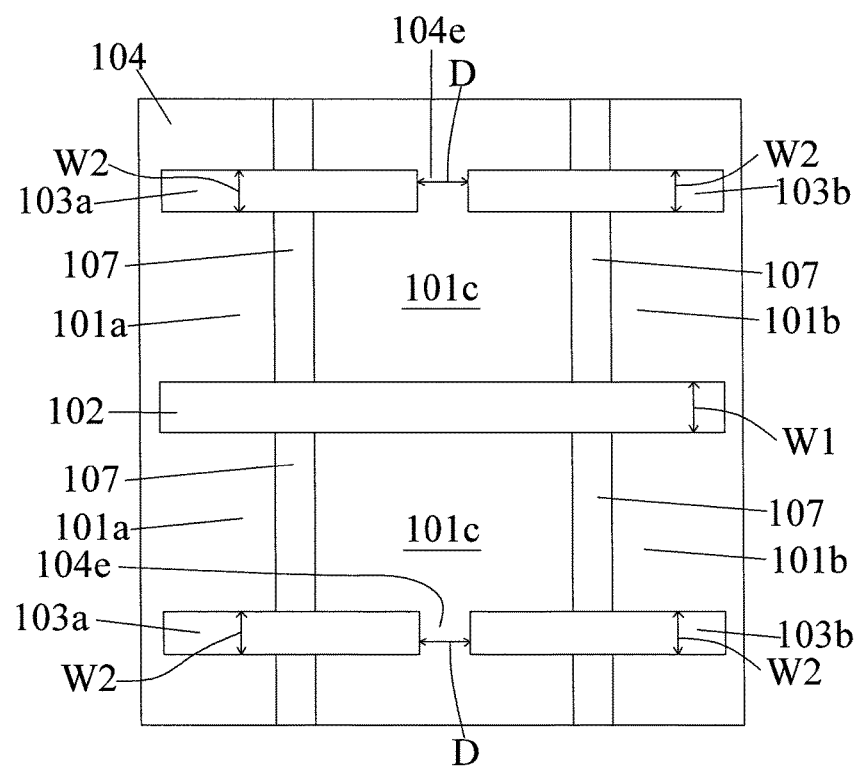

In operation 1005, a second gate 103 is formed as in FIGS. 21U-21AF. In some embodiments, the second gate 103 is disposed over the first active region 101a and the second active region 101.b. In some embodiments, the second gate 103 includes a gate fill metal. In some embodiments, the second gate 103 includes a first section 103a disposed over the first active region 101a and a second section 103b disposed over the second active region 101b. In some embodiments, a portion 104e of the ILD 104 is disposed between the first section 103a and the second section 1036b.

In some embodiments, the formation of the second gate 103 includes forming a second recess (104b, 104c) of the ILD 104. In some embodiments, the second recess (104b, 104c) is formed by any suitable operations such as etching. In some embodiments, the second recess (104b, 104c) is formed through the ILD 104 and is disposed over the first active region 101a and the second active region 101b. In some embodiments, the second recess (104b, 104c) is in a high aspect ratio of greater than about 10.

In some embodiments, the second recess (104b, 104c) is formed by disposing a photoresist over a portion 104e of the ILD 104 and removing the 104 uncovered by the photoresist through photolithography and etching operations. In some embodiments, the second recess (104b, 104c) includes a first section 104b and a second section 104c. The portion 104e of the ILD 104 is disposed between the first section 104b and the second section 104c.

In some embodiments, the second recess 104b is filled by a polysilicon and then is annealed at a predetermined temperature of about 200 degree Celsius to about 800 degree Celsius. In some embodiments, the polysilicon within the second recess 104b is removed from the second recess 104b, and then the second recess 104b is filled by the gate fill metal. As a result, the second gate 103 is formed.

Figure 21Y:
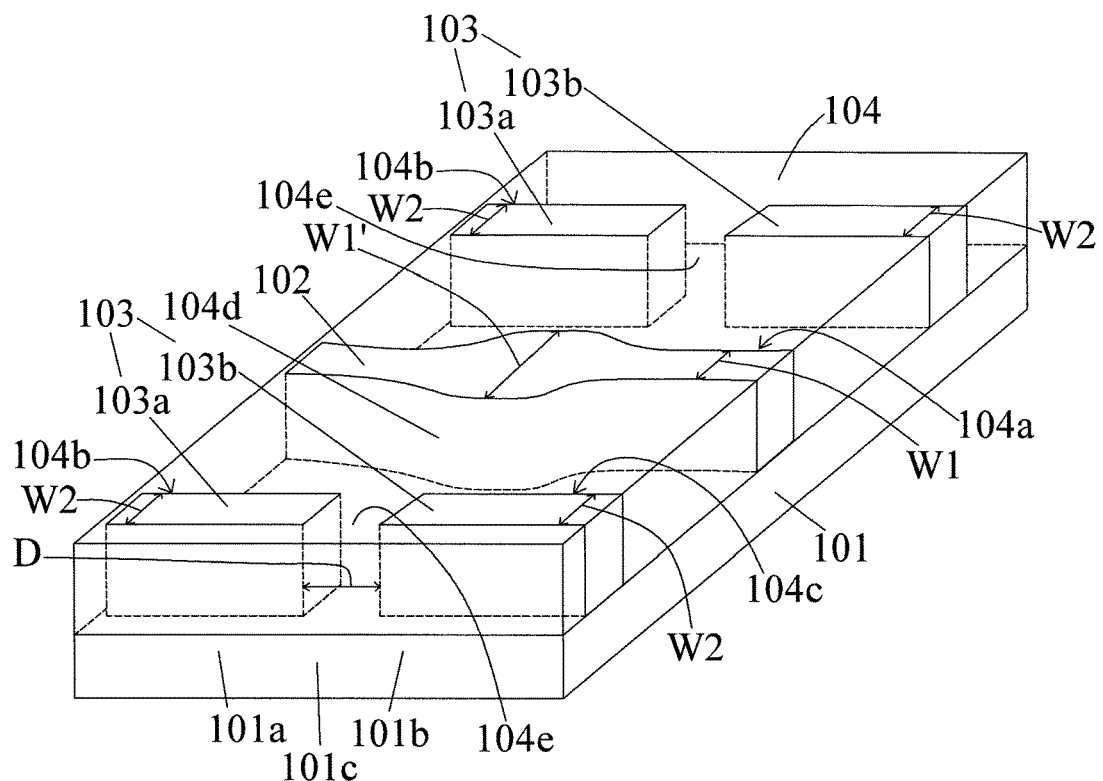
Figure 21Z:
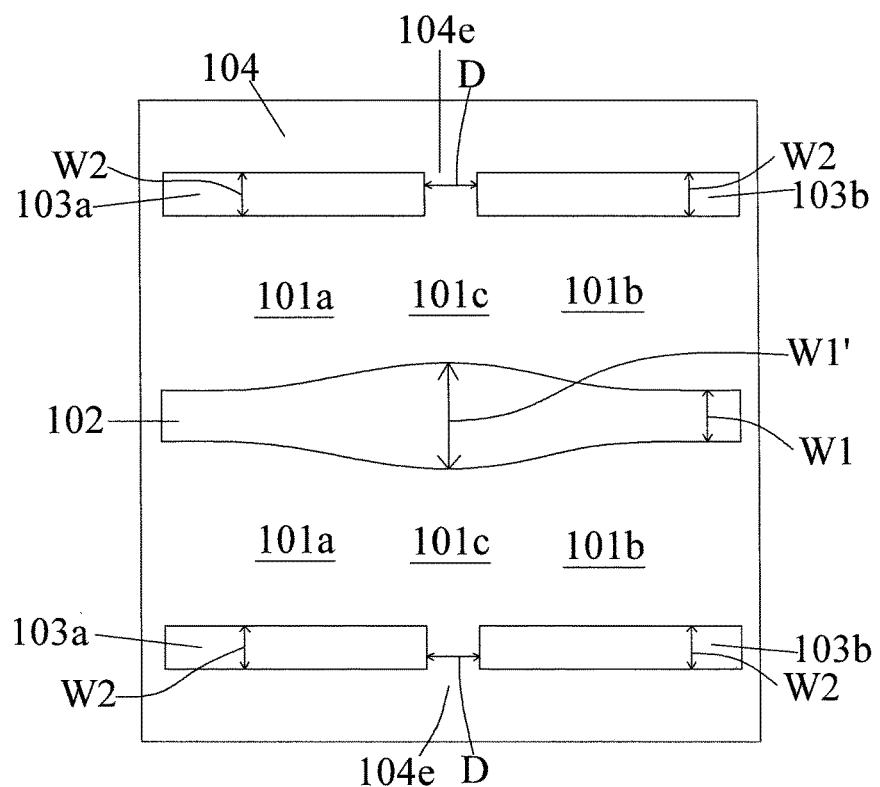
Figure 21A:
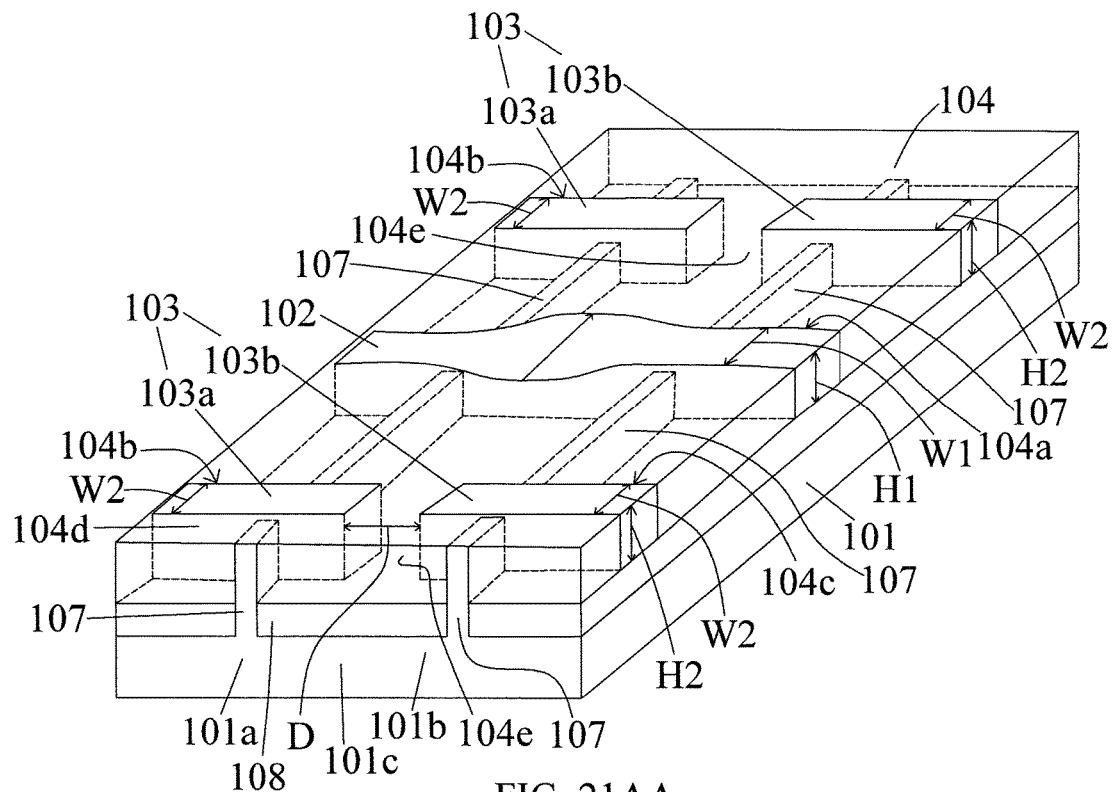
Figure 21A:
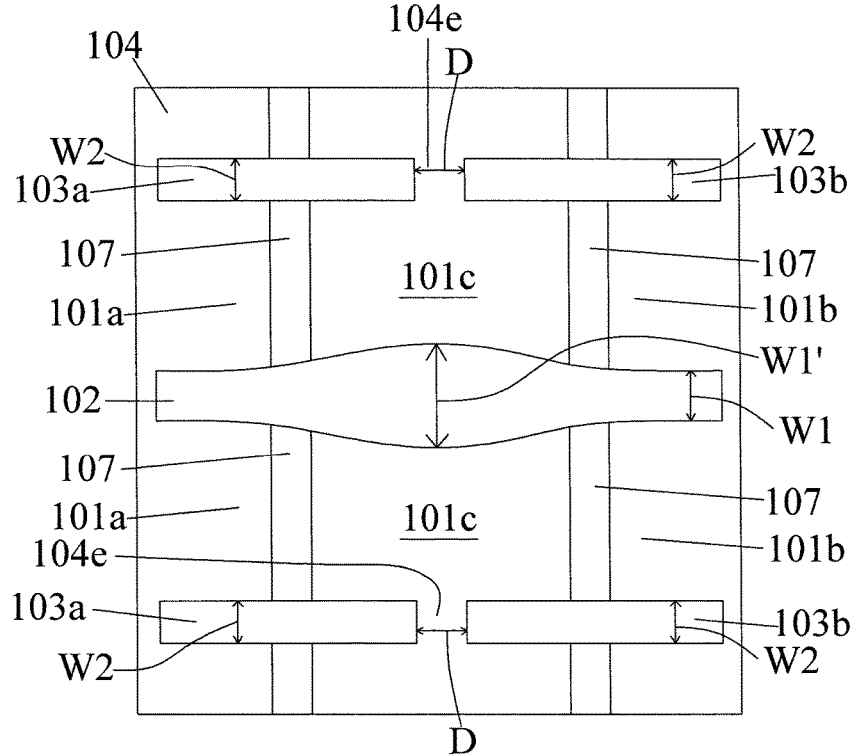
Figure 21A:
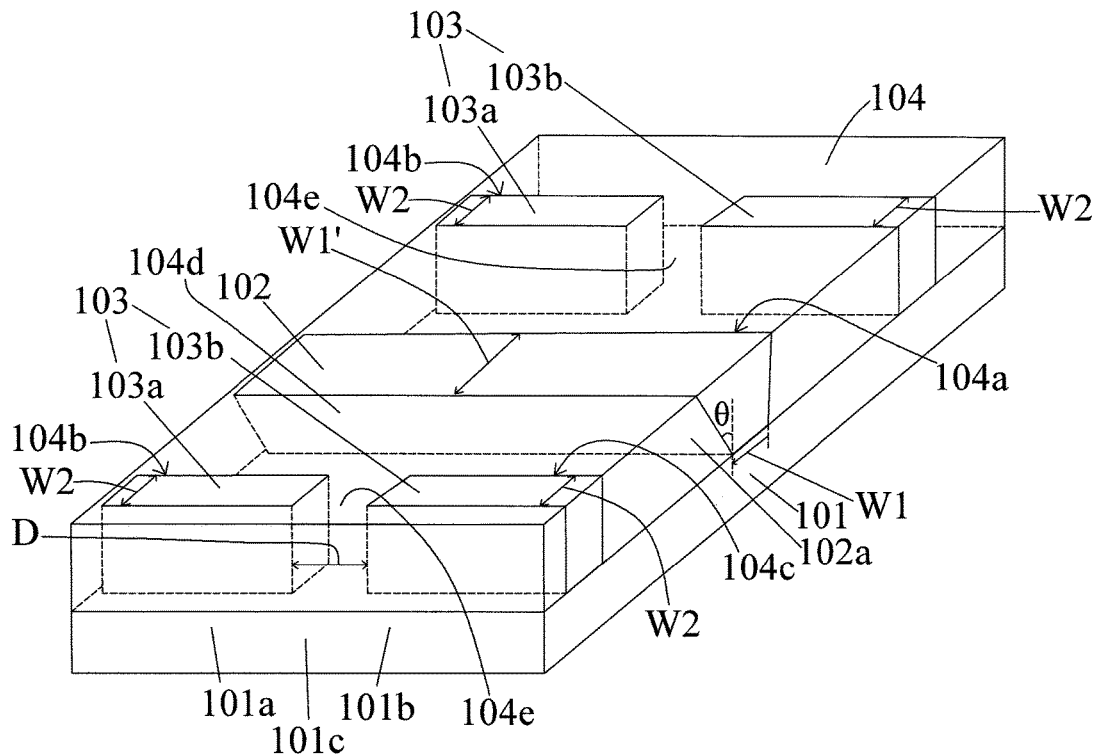
Figure 21A:
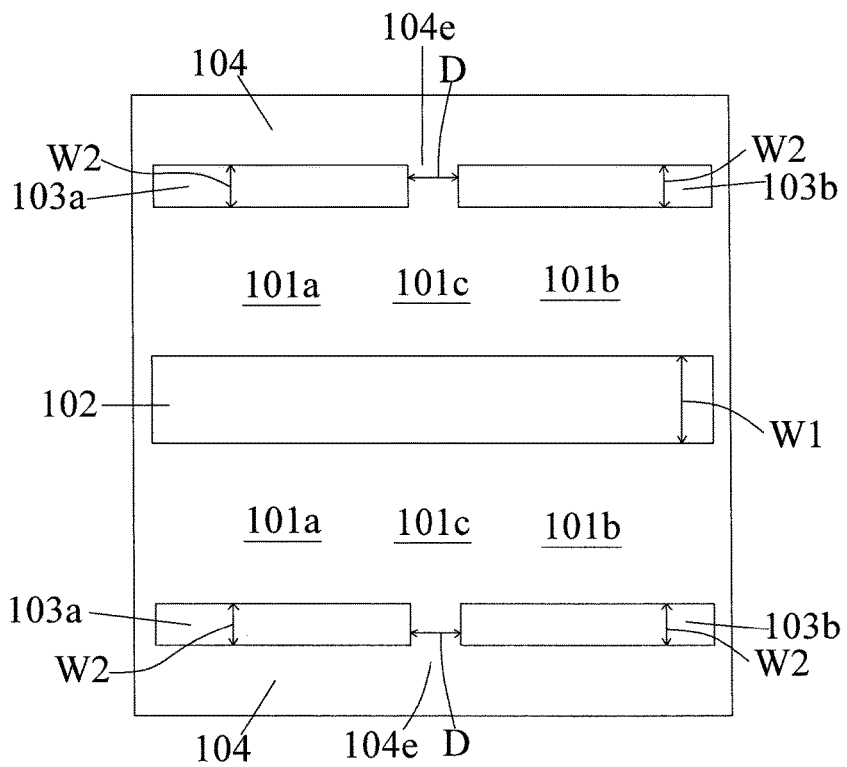
Figure 21A:
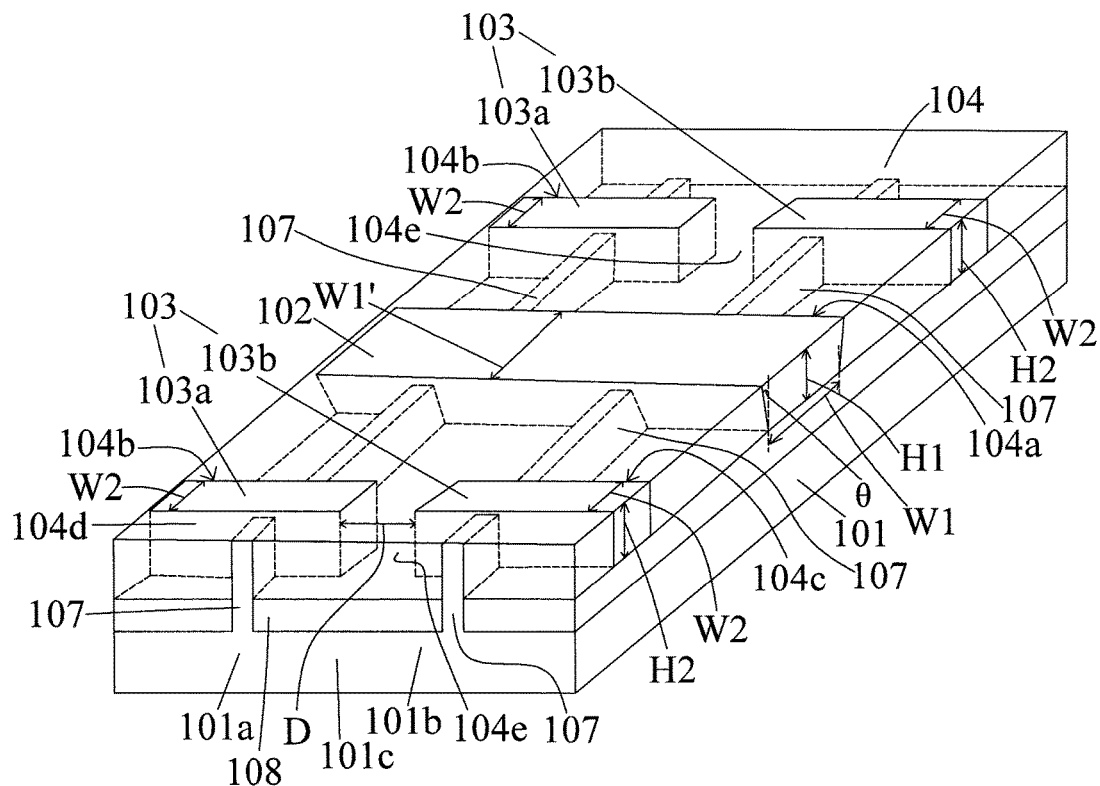
Figure 21A:
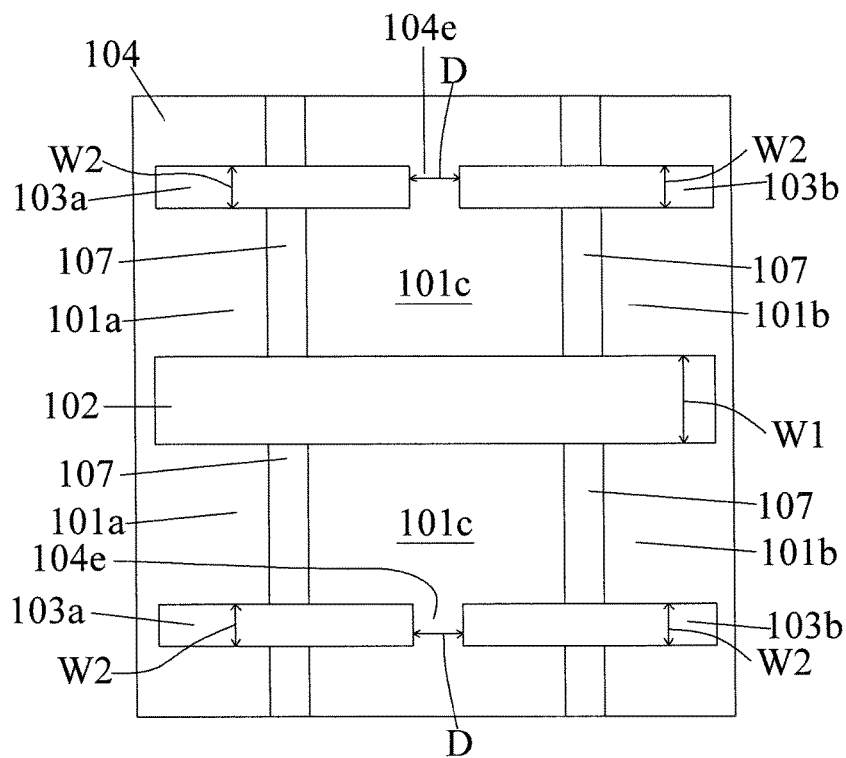

In some embodiments, the first recess 104a and the second recess 104b are formed simultaneously, and then the first recess 104a and the second recess 104b are filled by a polysilicon and annealed at a predetermined temperature of about 200 degree Celsius to about 800 degree Celsius. After the annealing operation, the polysilicon is removed from the first recess 104a and the second recess (104b, 104c). When the polysilicon is removed, a sidewall 104d of the first recess 104a is pulled towards the portion 104e of the ILD 104 disposed between the first section 104b and the second section 104c, thereby a width of a portion of the first recess 102 opposite to the portion 104e of the ILD 104 disposed between the first section 103a and the second section 103b is increased as shown in FIGS. 21Y-21AB. In some embodiments, a width of the first recess 102 is increased as shown in FIGS. 21AC-21AF when the polysilicon is removed from the first recess 102. In some embodiments, the width of the first recess 102 is increased from W1 to WV. In some embodiments, when the polysilicon is removed from the first recess 102, the sidewall 104d of the first recess 102 is tilted in an angle θ. The angle θ between the sidewall 104d and an axis orthogonal to the substrate 101 is about 1° to about 10°.

After the removal of the polysilicon from the first recess 104a and the second recess (104b, 104c), the first recess 104a and the second recess (104b, 104c) are filled by a gate fill metal to form the first gate 102 and the second gate 103 respectively. As the width of the first recess 104a is widened during the formation of the first gate 102, deposition of the gate fill metal into the first recess 104a is improved. Therefore, an improved first gate 102 is formed.

A semiconductor structure with a metal gate is improved. The semiconductor structure includes a first gate and a second gate includes a first section and a second section. An improved first gate is formed, since a first recess for forming the first gate is widen by an internal tensile stress developed within the ILD. The enlarged first recess would facilitate the formation of the first gate, ultimately a performance of the semiconductor structure is improved.

In some embodiments, a semiconductor structure includes a substrate including a first active region, a second active region and an isolation disposed between the first active region and the second active region; a plurality of gates disposed over the substrate and including a first gate extended over the first active region, the isolation and the second active region; and a second gate over the first active region and the second active region; and an inter-level dielectric (ILD) disposed over the substrate and surrounding the plurality of gates, wherein the second gate is configured not to conduct current flow and includes a first section disposed over the first active region and a second section disposed over the second active region, a portion of the ILD is disposed between the first section and the second section.

In some embodiments, the first section is distanced from the second section. In some embodiments, a ratio of a distance between the first section and the second section to a length of the first section protruded from the first active region is about 1:1, or a ratio of a distance between the first section and the second section to a length of the second section protruded from the second active region is about 1:1. In some embodiments, the first section has a length substantially greater than a length of the first active region, or the second section has a length substantially greater than the a length of the second active region. In some embodiments, each of the plurality of gates has a high aspect ratio of greater than about 10. In some embodiments, the first gate is a control gate, and the second gate is a dummy gate. In some embodiments, the substrate further includes a plurality of fins extending between the first gate and the second gate over the first active region or the second active region. In some embodiments, the substrate further includes a plurality of fins surrounded by the ILD. In some embodiments, the first gate and the second gate respectively includes a polysilicon or a gate fill metal. In some embodiments, an oxide layer is disposed at a bottom of the first gate and is contacted with the substrate, or a spacer is deposited along a sidewall of the first gate. In some embodiments, the ILD includes silicon oxide, silicon dioxide, silicon oxynitride, silicon oxynitride doped with hydrogen or silicon oxide doped with carbon.

In some embodiments, a method of manufacturing a semiconductor structure includes receiving a substrate; patterning a first active region, a second active region and an isolation between the first active region and the second active region over the substrate; disposing an inter-level dielectric (ILD) over the substrate; forming a first gate extended over the first active region, the isolation and the second active region; and forming a second gate over the first active region and the second active region, wherein the second gate includes a first section disposed over the first active region and a second section disposed over the second active region, a portion of the ILD is disposed between the first section and the second section.

In some embodiments, the forming the first gate or the forming the second gate includes annealing the semiconductor structure at a predetermined temperature of about 200 degree Celsius to about 800 degree Celsius. In some embodiments, the forming the first gate includes forming a sidewall of the first gate tilted in an angle, and the angle between the sidewall and an axis orthogonal to the substrate is about 1° to about 10°. In some embodiments, the forming the first gate includes widening a width of a portion of the first gate opposite to the portion of the ILD disposed between the first section and the second section.

In some embodiments, a method of manufacturing the semiconductor structure includes receiving a substrate patterned with a first active region, a second active region, an isolation and a plurality of fins; disposing an inter-level dielectric (ILD) over the substrate and around the plurality of fins; forming a first recess through the ILD and extended over the first active region, the isolation and the second active region; forming a second recess through the ILD and disposed over the first active region and the second active region; disposing a polysilicon within the first recess and the second recess; annealing the semiconductor structure at a predetermined temperature; removing the polysilicon from the first recess and the second recess, thereby a width of a portion of the first recess opposite to the portion of the ILD disposed between a first section of the second recess and the second section of the second recess is increased; and filling the first recess and the second recess by a gate fill metal.

In some embodiments, the removing the polysilicon includes pulling a sidewall of the first recess towards the portion of the ILD disposed between the first section and the second section to increase the width of the portion of the first recess. In some embodiments, the removing the polysilicon includes forming a sidewall of the first recess tilted in an angle, and the angle between the sidewall and an axis orthogonal to the substrate is about 1° to about 10°. In some embodiments, the forming the second recess includes disposing a photoresist over a portion of the ILD between the first section and the second section, and removing the ILD uncovered by the photoresist through photolithography and etching operations. In some embodiments, the first recess and the second recess are in a high aspect ratio of greater than about 10.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a substrate;
   forming a first active region, a second active region and an isolation between the first active region and the second active region over the substrate;
   disposing an inter-level dielectric (ILD) over the substrate;
   forming a first gate extended over the first active region, the isolation and the second active region; and
   forming a second gate over the first active region and the second active region, wherein the second gate includes a first section disposed over the first active region and a second section disposed over the second active region, a portion of the ILD is disposed between the first section and the second section, wherein the forming the first gate includes increasing a width of a portion of the first gate disposed opposite to the portion of the ILD.

2. The method of claim 1, wherein the forming the first gate includes widening a width of the first gate.

3. The method of claim 1, wherein the forming the first gate or the forming the second gate includes annealing the semiconductor structure at a predetermined temperature of about 200 degree Celsius to about 800 degree Celsius.

4. The method of claim 1, wherein the forming the first gate includes forming a sidewall of the first gate tilted in an angle, and the angle between the sidewall and an axis orthogonal to the substrate is about 1° to about 10°.

5. The method of claim 1, wherein the portion of the ILD is disposed over the isolation.

6. The method of claim 1, wherein the first gate or the second gate is formed by filling gate fill metal.

7. The method of claim 1, wherein the forming the first active region and the second active region includes doping operations.

8. The method of claim 1, further comprising forming a semiconductor fin over the first active region or the second active region.

9. A method of manufacturing the semiconductor structure, comprising:
   receiving a substrate patterned with a first active region, a second active region, an isolation and a plurality of fins;
   disposing an inter-level dielectric (ILD) over the substrate and around the plurality of fins;
   forming a first recess through the ILD and extended over the first active region, the isolation and the second active region;
   forming a second recess through the ILD and disposed over the first active region and the second active region;
   disposing a polysilicon within the first recess and the second recess;
   annealing the semiconductor structure at a predetermined temperature;
   removing the polysilicon from the first recess and the second recess; and
   filling the first recess and the second recess by gate fill metal,
   wherein the removing the polysilicon from the first recess includes increasing a width of a portion of the first recess.

10. The method of claim 9, wherein the removing the polysilicon from the first recess includes forming a sidewall of the first recess tilted in an angle, and the angle between the sidewall and an axis orthogonal to the substrate is about 1° to about 10°.

11. The method of claim 9, wherein the forming the second recess includes forming a first section over the first active region and forming a second section over the second active region, a portion of the ILD is disposed between the first section and the second section, the portion of the first recess is disposed opposite to the portion of the ILD.

12. The method of claim 11, wherein a first width of the first recess disposed opposite to the portion of the ILD is substantially greater than a second width of the first recess disposed opposite to the first section or the second section.

13. The method of claim 9, wherein the first recess and the second recess are in a high aspect ratio of greater than about 10.

14. The method of claim 9, wherein the forming the first recess and the forming the second recess includes photolithography and etching operations.

15. The method of claim 9, wherein the forming the second recess includes disposing a photoresist over the ILD and removing the ILD uncovered by the photoresist.

16. A method of manufacturing the semiconductor structure, comprising:

receiving a substrate including a first active region, a second active region, an isolation between the first active region and the second active region;

disposing an inter-level dielectric (ILD) over the substrate;

forming a first recess through the ILD and extended over the first active region, the isolation and the second active region;

forming a second recess through the ILD and disposed over the first active region and the second active region;

disposing a polysilicon within the first recess and the second recess; and removing the polysilicon from the first recess and the second recess, wherein the ILD comprises an internal stress, and a width of the first recess is increased by the internal stress from the ILD when the polysilicon is removed from the first recess.

17. The method of claim 16, wherein the sidewall of the first recess is disposed over the isolation.

18. The method of claim 16, wherein a first width of the first recess disposed over the isolation is substantially greater than a second width of the second recess disposed over the first active region or the second active region.

* * * * *